United States Patent
Klaerner et al.

(10) Patent No.: US 12,390,839 B2
(45) Date of Patent: Aug. 19, 2025

(54) CLEANING SYSTEMS FOR WIRE BONDING TOOLS, WIRE BONDING MACHINES INCLUDING SUCH SYSTEMS, AND RELATED METHODS

(71) Applicant: Kulicke and Soffa Industries, Inc., Fort Washington, PA (US)

(72) Inventors: Peter Klaerner, Corona, CA (US); Jose de Jesus Lozano de Alva, Lake Forest, CA (US); Jason Fu, Long Beach, CA (US); Masih Mahmoodi, Irvine, CA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 16/262,761

(22) Filed: Jan. 30, 2019

(65) Prior Publication Data

US 2019/0237427 A1    Aug. 1, 2019

Related U.S. Application Data

(60) Provisional application No. 62/624,037, filed on Jan. 30, 2018.

(51) Int. Cl.
*B08B 1/12*      (2024.01)
*B08B 1/20*      (2024.01)
(Continued)

(52) U.S. Cl.
CPC .................. *B08B 1/12* (2024.01); *B08B 1/20* (2024.01); *B08B 1/34* (2024.01); *B08B 3/02* (2013.01);
(Continued)

(58) Field of Classification Search
CPC ............. H01L 2224/7801; H01L 24/78; H01L 2224/78343; H01L 2224/78621;
(Continued)

(56) References Cited

U.S. PATENT DOCUMENTS 4,771,930 A * 9/1988 Gillotti .................. H01L 24/85
228/180.5
5,205,460 A * 4/1993 Sato .................. H01L 21/67017
228/6.2
(Continued)

FOREIGN PATENT DOCUMENTS

JP      02-248055      10/1990
JP      03052777 A * 3/1991 ............. B23K 9/328
(Continued)

OTHER PUBLICATIONS

European Search Opinion for EP 19748156 dated Jan. 13, 2022 (Year: 2022).*

(Continued)

*Primary Examiner* — Douglas Lee
(74) *Attorney, Agent, or Firm* — Christopher M. Spletzer, Sr.

(57) ABSTRACT

A method of cleaning a tip of a wire bonding tool on a wire bonding machine is provided. The method includes the steps of: (a) moving a wire away from the wire bonding tool such that the tip of the wire bonding tool is accessible to a cleaning station of the wire bonding machine; and (b) cleaning at least a portion of the tip of the wire bonding tool with the cleaning station after step (a).

22 Claims, 28 Drawing Sheets

(51) Int. Cl.
    *B08B 1/34*           (2024.01)
    *B08B 3/02*           (2006.01)
    *B08B 7/00*           (2006.01)
    *B23K 37/00*         (2025.01)
    *H01L 23/00*        (2006.01)

(52) U.S. Cl.
    CPC .......... *B08B 7/0028* (2013.01); *B08B 7/0035* (2013.01); *B08B 7/0042* (2013.01); *B23K 37/00* (2013.01); *H01L 24/78* (2013.01); *H01L 2224/7801* (2013.01); *H01L 2224/78343* (2013.01); *H01L 2224/78621* (2013.01); *H01L 2224/78756* (2013.01)

(58) Field of Classification Search
    CPC . H01L 2224/78756; B08B 1/002; B08B 1/02; B08B 1/04; B08B 3/02; B08B 7/0028; B08B 7/0035; B08B 7/0042; B23K 20/005; B23K 20/007; B23K 20/233; B23K 20/26; B23K 2101/42; B23K 31/125; B23K 37/00
    See application file for complete search history.

(56) References Cited

U.S. PATENT DOCUMENTS

| | | | | |
|---|---|---|---|---|
| 5,943,726 | A * | 8/1999 | Eitoku | .............. H01L 21/67046 15/88.2 |
| 7,004,373 | B1 * | 2/2006 | Miller | ..................... H01L 24/85 228/103 |
| 8,464,736 | B1 * | 6/2013 | Lenz | ................. H01L 21/67017 134/108 |
| 2002/0096187 | A1 | 7/2002 | Kuwata et al. | |
| 2003/0037804 | A1 * | 2/2003 | Erdmann | ................ B23K 1/018 134/32 |
| 2005/0184133 | A1 * | 8/2005 | Clauberg | ........... B23K 26/1462 228/203 |
| 2006/0219754 | A1 | 10/2006 | Clauberg et al. | |
| 2008/0163899 | A1 * | 7/2008 | Takiguchi | ............. B08B 7/0057 134/30 |
| 2013/0341377 | A1 * | 12/2013 | Cheng | ..................... H01L 24/85 228/4.5 |
| 2014/0094650 | A1 * | 4/2014 | Schaning | ............... A61B 1/313 606/1 |
| 2015/0155254 | A1 * | 6/2015 | Schmidt-Lange | ...... H01L 24/81 228/104 |

FOREIGN PATENT DOCUMENTS

| | | | | |
|---|---|---|---|---|
| JP | 05190589 | A * | 7/1993 | ............ H01L 24/45 |
| JP | H06-318618 | | 11/1994 | |
| JP | 07321143 | | 12/1995 | |
| JP | 2002313765 | A * | 10/2002 | |
| JP | 2008-147550 | A | 6/2008 | |
| JP | 2012-015262 | | 1/2012 | |
| KR | 100889297 | B1 | 3/2009 | |
| WO | WO2010030052 | A1 * | 3/2010 | |

OTHER PUBLICATIONS

Machine translation of JP03-052777A (Year: 1991).*
Machine translation of JP2002-313765A (Year: 2002).*
International Search Report Dated May 21, 2019 for International Patent Application No. PCT/US2019/015918.

* cited by examiner

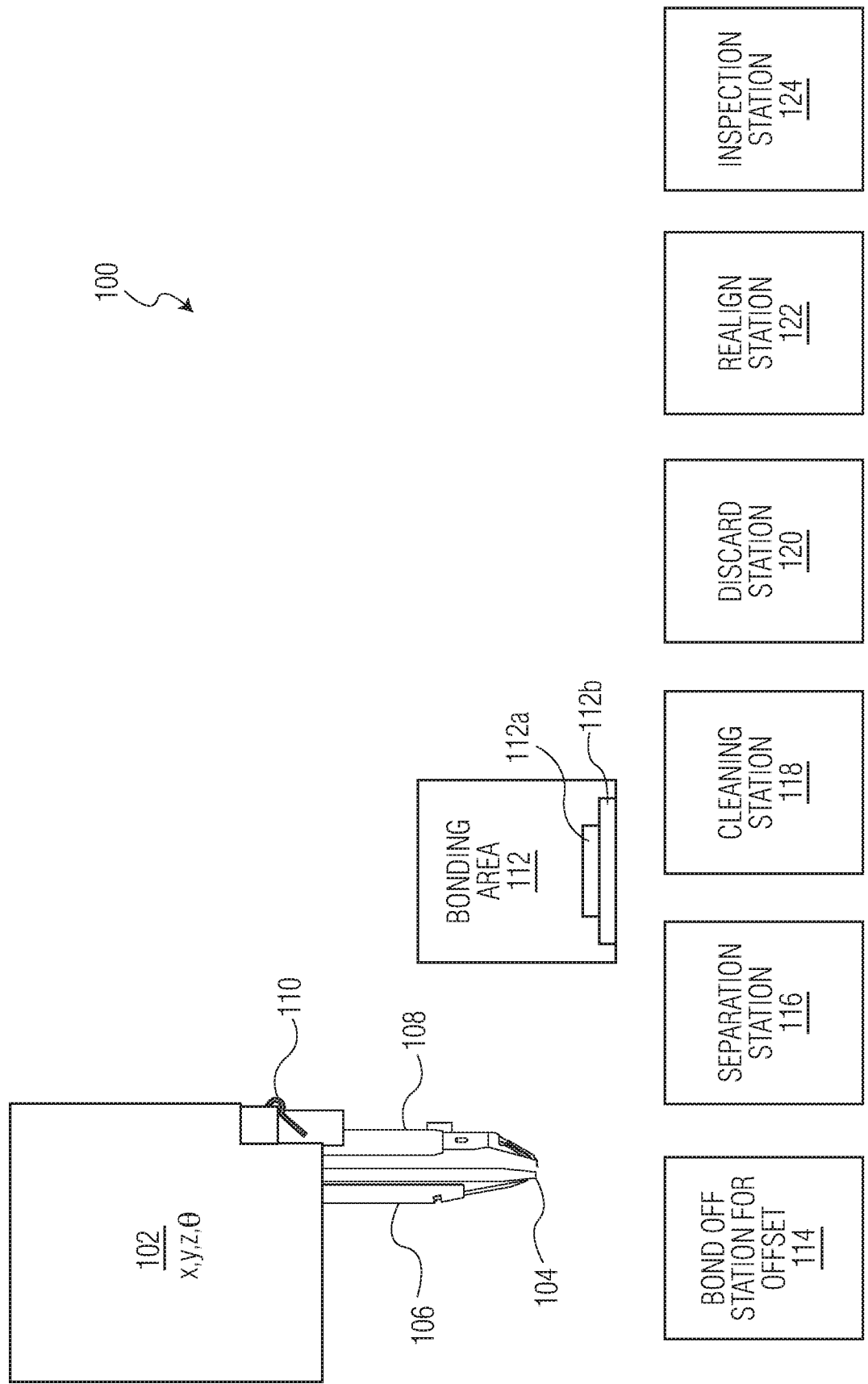

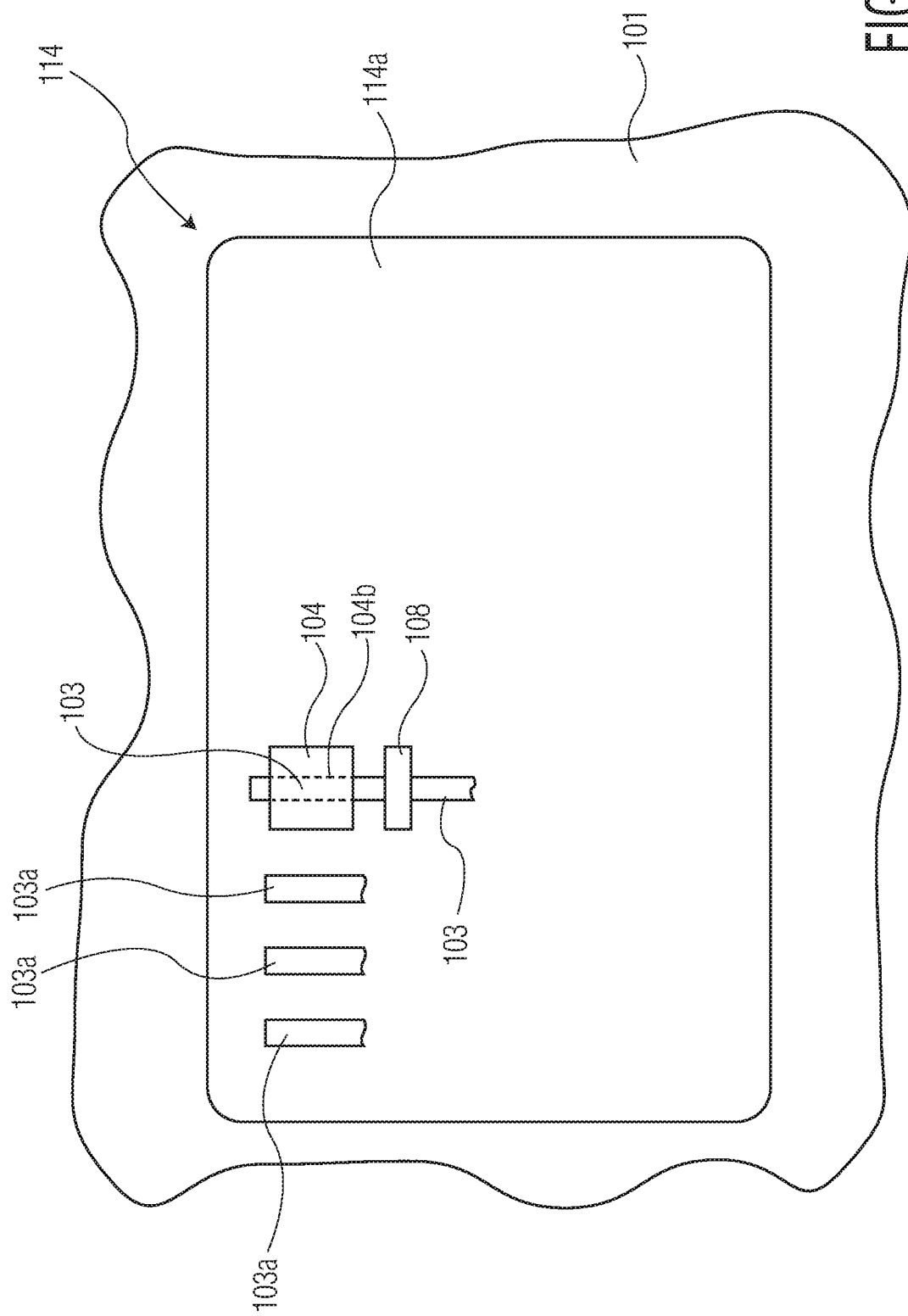

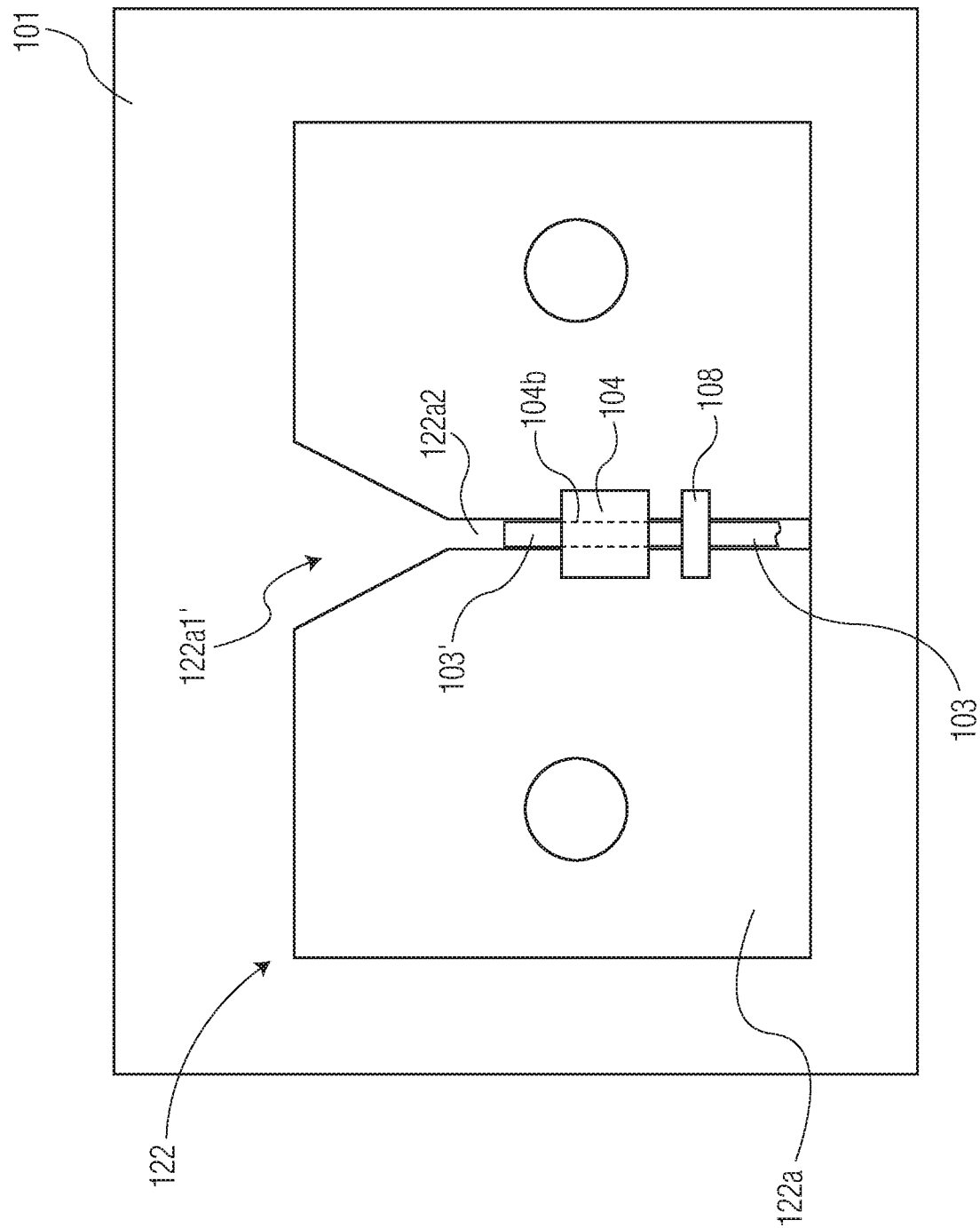

CLEANING SYSTEMS FOR WIRE BONDING TOOLS, WIRE BONDING MACHINES INCLUDING SUCH SYSTEMS, AND RELATED METHODS

CROSS-REFERENCE TO RELATED APPLICATION

This application claims the benefit of U.S. Provisional Application No. 62/624,037 filed on Jan. 30, 2018, the content of which is incorporated herein by reference.

FIELD

The invention relates to the cleaning of wire bonding tools, and more particularly, to improved systems and methods for cleaning wire bonding tools on wire bonding machines.

BACKGROUND

In the semiconductor packaging industry, and other industries requiring electrical interconnection, wire and ribbon bonding are widely adopted technologies using a wire bonding machine. In connection with wire and ribbon bonding operations, various types of energy (e.g., ultrasonic energy, thermosonic energy, thermocompressive energy, etc.) are used to bond an end portion of wire/ribbon to a first bonding location. After a first bond is formed at the first bonding location, a length of wire/ribbon is extended to second bonding location, and then a second bond is formed at the second bonding location.

Exemplary conductive materials used for the wire/ribbon in conventional wire bonding (e.g., ball bonding, wedge bonding, ribbon bonding, etc.) include aluminum, copper, gold, among others.

A challenge in wire bonding is contamination of the wire bonding tool used in the wire bonding operation. For example, in wedge and ribbon bonding operations, the tool may become contaminated with bits of wire (e.g., aluminum wire). This contamination has an impact on the effectiveness of the wire bonding operation. Replacement and/or cleaning of the tool may result in operational delay and excessive costs.

Thus, it would be desirable to provide improved cleaning systems for wire bonding tools on wire bonding machines, improved wire bonding machines including such cleaning systems, and ribbon bonding tools, and improved methods of cleaning wire bonding tools on a wire bonding machines.

SUMMARY

According to an exemplary embodiment of the invention, a wire bonding machine is provided. The wire bonding machine includes: (a) a wire bonding tool; (b) a wire guide for guiding a wire to a position beneath a bonding surface of the wire bonding tool, the wire guide being configured for movement between (i) an engagement position with respect to the wire bonding tool (e.g., see FIG. 3B) and (ii) a non-engagement position with respect to the wire bonding tool (see FIG. 3D); and (c) a cleaning station for cleaning at least a portion of a tip of the wire bonding tool when the wire guide is in the non-engagement position. The engagement position is a position whereby the wire guide guides an end portion of wire to the position beneath the bonding (working) surface of the wire bonding tool. The non-engagement position is a position whereby the wire guide has been moved away from (e.g., swiveled away from) the engagement position.

According to another exemplary embodiment of the invention, a wire bonding machine is provided. The wire bonding machine includes: (a) a wire bonding tool; and (b) a cleaning station for cleaning the wire bonding tool, the cleaning station including at least one brush, wherein the at least one brush includes a stationary brush on the wire bonding machine, and wherein the wire bonding tool is configured to be moved such that a tip of the wire bonding tool is in contact with the stationary brush during a cleaning operation.

According to yet another exemplary embodiment of the invention, a method of cleaning a tip of a wire bonding tool on a wire bonding machine is provided. The method includes the steps of: (a) moving a wire away from the wire bonding tool such that the tip of the wire bonding tool is accessible to a cleaning station of the wire bonding machine; and (b) cleaning at least a portion of the tip of the wire bonding tool with the cleaning station after step (a).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 1 is a block diagram view of elements of a wire bonding machine in accordance with an exemplary embodiment of the invention;

FIGS. 2A-2C are block diagrams illustrating a bond off station of a wire bonding machine in accordance with an exemplary embodiment of the invention;

FIGS. 10A-10D are block diagrams illustrating a realignment station of a wire bonding machine in accordance with an exemplary embodiment of the invention.

DETAILED DESCRIPTION

Figure 2A:
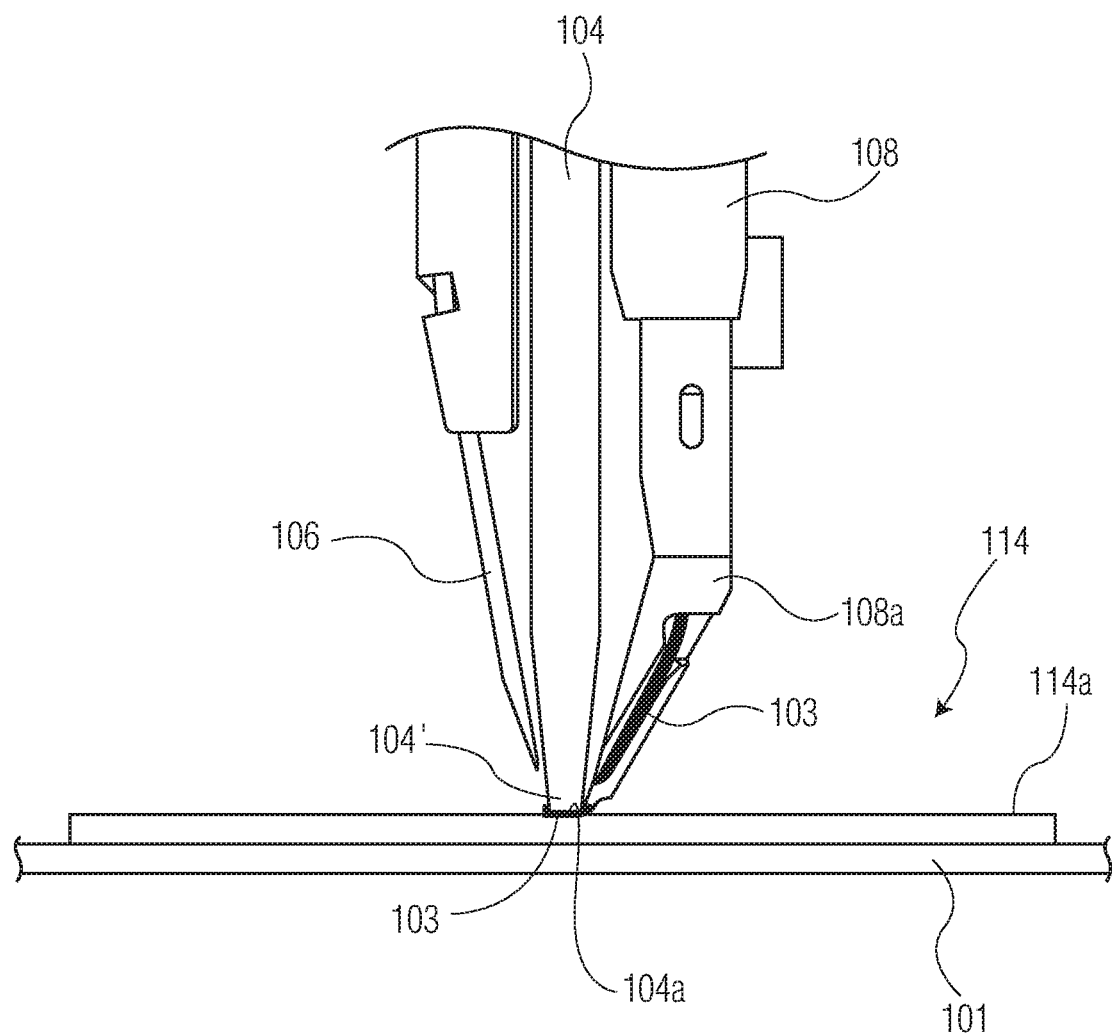

As used herein, the term "wire bonding tool" may refer to any type of tool used to bond a portion of wire against a workpiece. Exemplary wire bonding tools include wedge bonding tools (sometimes referred to as wedge tools, or wedges), ball bonding tools (sometimes referred to as capillary tools or capillaries), and ribbon bonding tools. Thus, the term "wire bonding machine", as recited herein, may refer to wedge bonding machines, ball bonding machines, ribbon bonding machines, stud bumping machines, etc.

In accordance with exemplary aspects of the invention, tool buildup (e.g., debris, contaminants, etc.) may be removed from the tool tip of a wire bonding tool by one of plurality of exemplary inventive cleaning sequences. Such a cleaning sequence may be automatic (e.g., triggered by the occurrence of a predetermined event, such as completion of a predetermined time interval or a predetermined number of operations or triggering of process signals). Alternatively, the cleaning sequence may be user-triggered.

A specific exemplary sequence is as follows: the bonding tool is moved (e.g., using the bond head assembly) to a wire handling location; the wire is moved away from the wire bonding tool (e.g., either manually or automatically); and the wire bonding tool is moved to a cleaning station of the wire bonding machine (e.g., where the cleaning station may include one or more brushes, a laser, a pre-form, among other mechanisms). At the cleaning station, a portion of the wire bonding tool (e.g., the tip portion, including the working surface of the wire bonding tool) is cleaned using the cleaning station.

In the case of a brush, the wire bonding tool may be moved to a location on top of the brush. The wire bonding machine may determine a "first touch" position. After determining the "first touch" position, the wire bonding tool is is lowered in the Z-direction by a certain distance or until a certain force is measured. The wire bonding machine performs brushing motions of the tool against the brush (e.g., zig-zag motions or some other predetermined motion profile), for example, until a certain time or number of brush moves have been completed. It is noteworthy that the motions may be completed by the wire bonding tool, the brush, or both.

After cleaning (and regardless of which type of cleaning station is used), the wire bonding tool may be moved to an inspection location on the wire bonding machine where the level of cleanliness of the wire bonding tool tip may be evaluated (e.g., manually by an operator, automatically using a vision system and a computer, etc.).

After cleaning, and optional inspection, the wire bonding tool may then move to a wire handling location, and the wire is moved back in position in connection with the wire bonding tool (e.g., under the tool tip or working face of the wire bonding tool). A manual or automated bond off (e.g., a single-bond including a pull-test) may be performed at a bond-off location of the wire bonding machine. If it is determined that the wire bonding tool has been properly cleaned (or if no check inspection is completed) the wire bonding machine may then return to production.

Throughout the various drawings, like reference numerals refer to the like elements, except where explained herein.

Referring specifically to FIG. 1, a block diagram of a wire bonding machine 100 is provided. Wire bonding machine 100 is exemplary in nature, and the invention is not limited to the details shown in FIG. 1. For example, FIG. 1 illustrates a specific type of wire bonding tool (a wedge bonding tool for ultrasonic wedge bonding) and bond head elements; however, the invention is not limited to this specific type of wire bonding tool or bond head elements. Further, FIG. 1 illustrates a plurality of "stations" of wire bonding machine 100. It is understood that the invention does not require each of these stations. Rather, selected ones of these stations (or other stations or mechanisms within the scope of the invention) may be selected for a given application. Further, the stations are not limited to use in the order shown. Rather, a station (e.g., an inspection station) may be used at any time during the proces as desired.

Wire bonding machine 100 includes a bond head assembly 102. Bond head assembly 102 carries wire bonding tool 104, cutter 106 (for cutting wire), and wire guide assembly 108 (including wire guide 108a, shown, for example, in FIG. 2A). Wire 103 (e.g., see FIG. 2A) is guided by wire guide assembly 108 to a position beneath a bonding surface of wire bonding tool 104. Bond head assembly 102 also carries locking mechanism 110 (explained in greater detail below). Bond head assembly 102 is configured for motion along the x-axis of wire bonding machine 100, along the y-axis of wire bonding machine 100, along the z-axis of wire bonding machine 100, and about the theta axis of wire bonding machine 100. Thus, wire bonding tool 104 may be moved along (and about) these axes as is desired in connection with the cleaning operations (and related operations) described herein.

Wire bonding machine 100 includes bonding area 112. At bonding area 112, wire bonding tool 104 bonds wire 103 (e.g., see FIG. 2A) to provide electrical interconnections for the given application. In the example shown in FIG. 1, bonding wire 103 will be bonded between first workpiece 112a (e.g., a semiconductor element, such as a semiconductor die) and second workpiece 112b (e.g., a substrate, such as a leadframe, another semiconductor element, etc.).

As shown in FIG. 1, wire bonding machine 100 includes bond off station 114, separation station 116, cleaning station 118, discard station 120, realign station 122, and inspection station 124. Examples of various of these "stations" are provided throughout the subsequent drawings. It will be appreciated that the term "station" shall be broadly defined as an area of the wire bonding machine adapted for a specific function/operation.

Figure 2C:
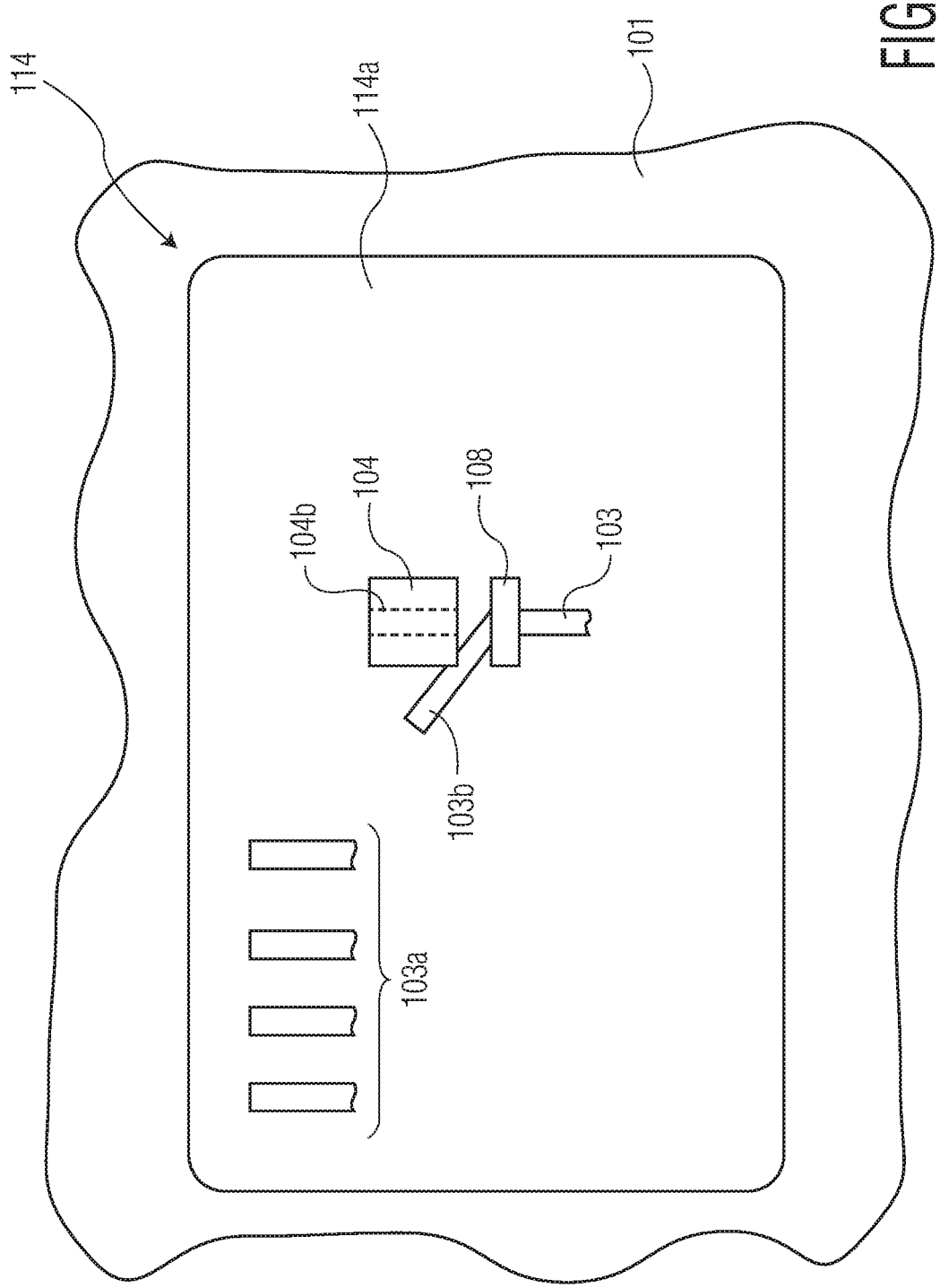
Figure 3A:
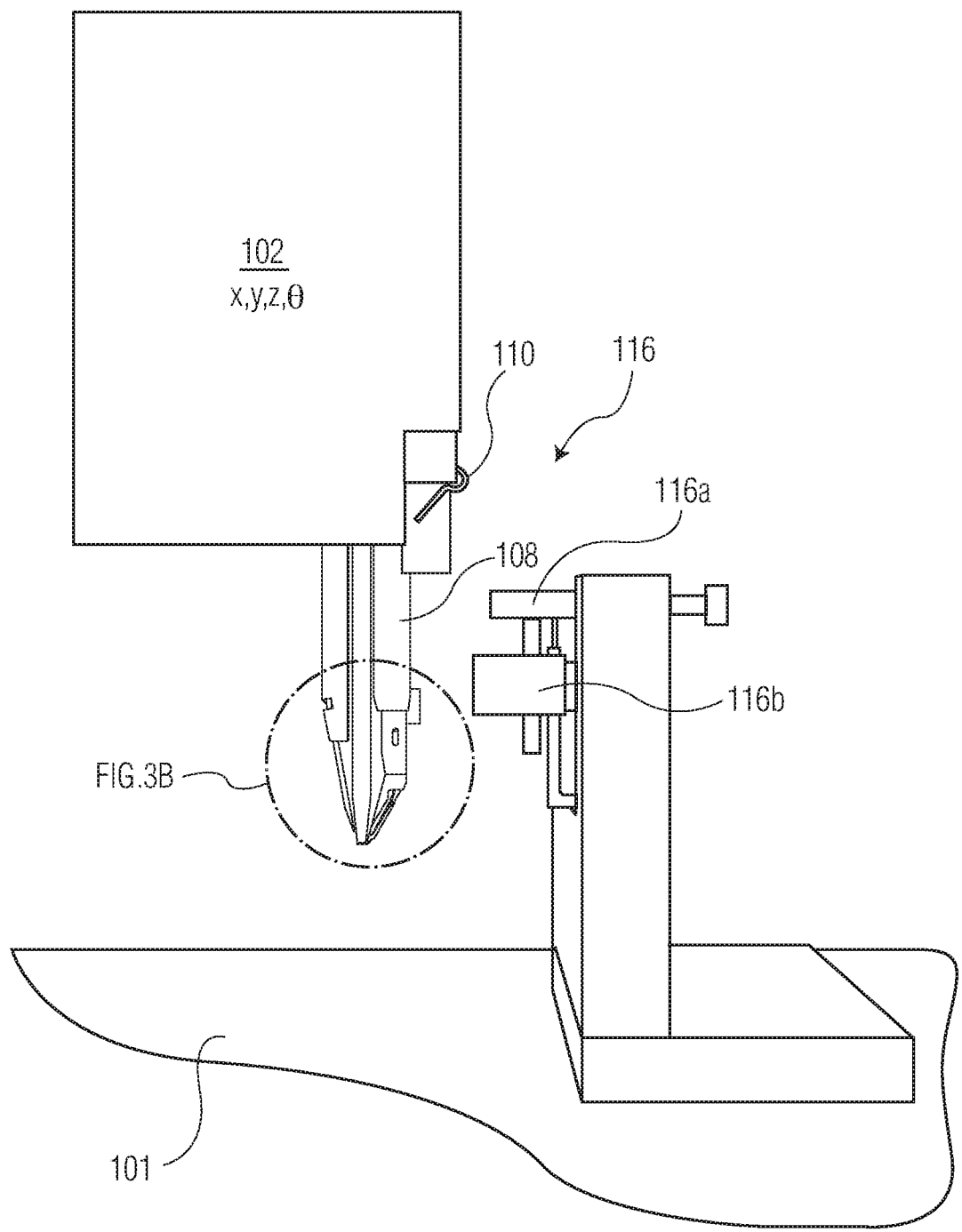
FIGS. 3A-3D are block diagrams illustrating a separation station of a wire bonding machine in accordance with an exemplary embodiment of the invention.
Figure 3B:
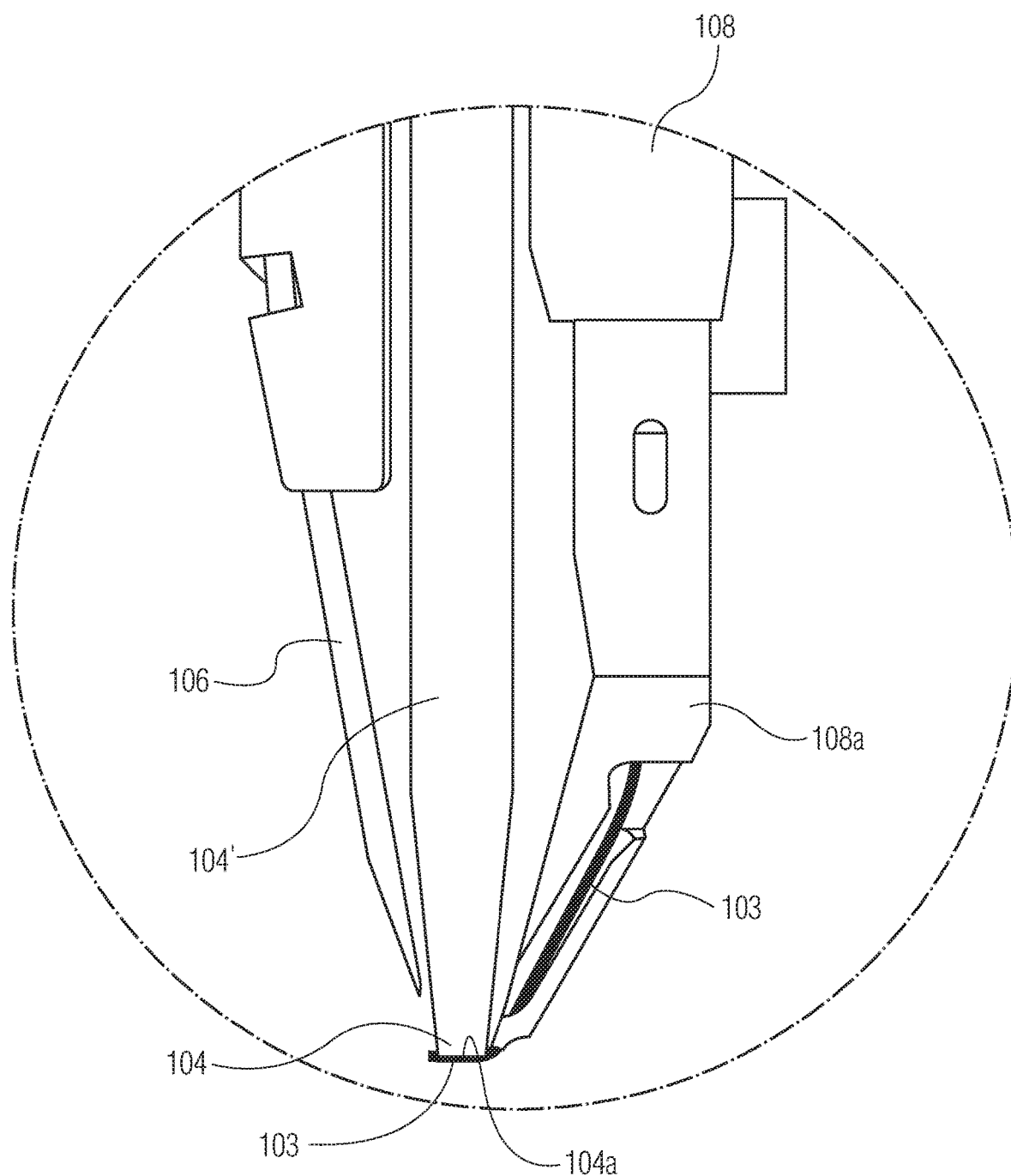
Figure 3C:
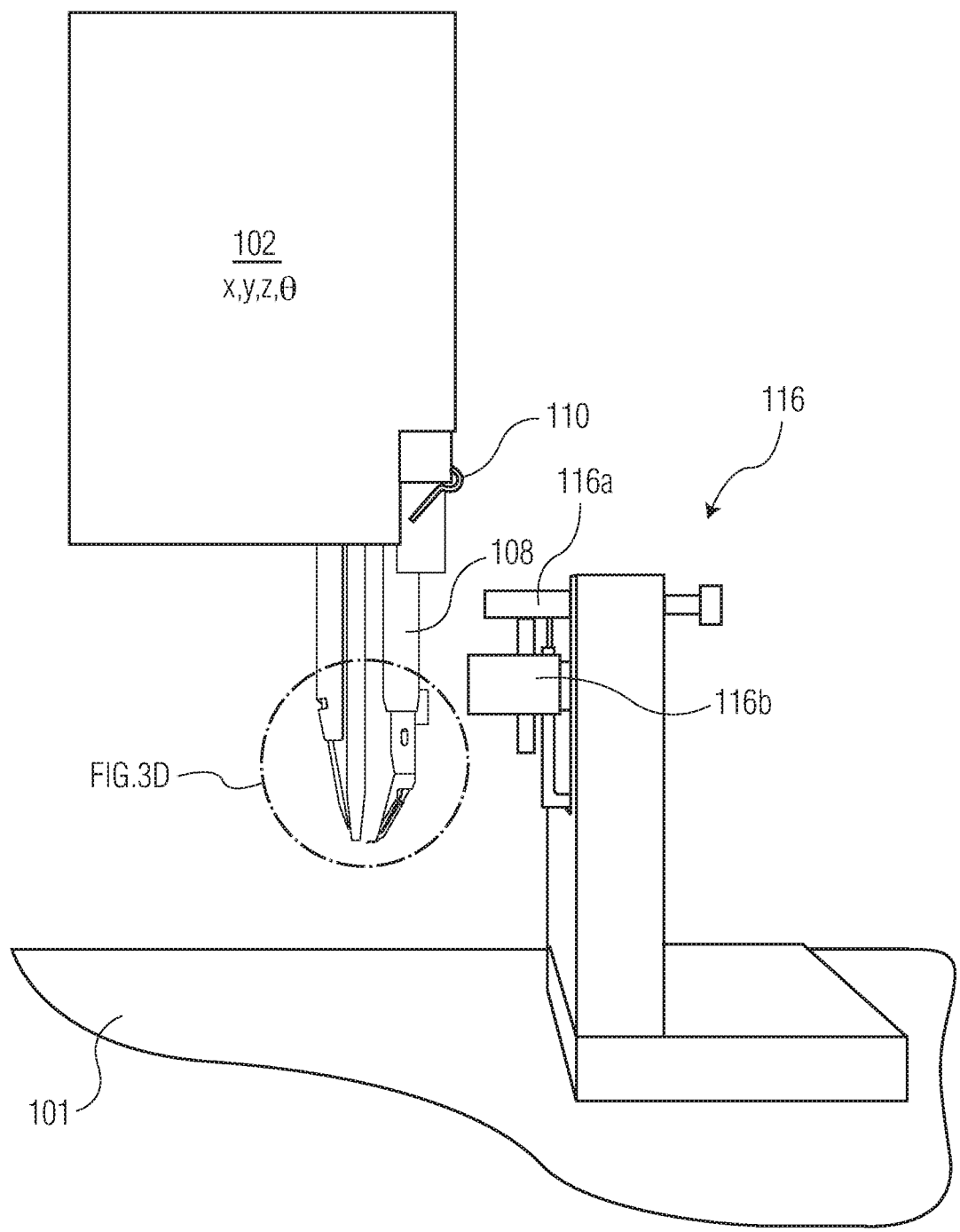
Figure 3D:
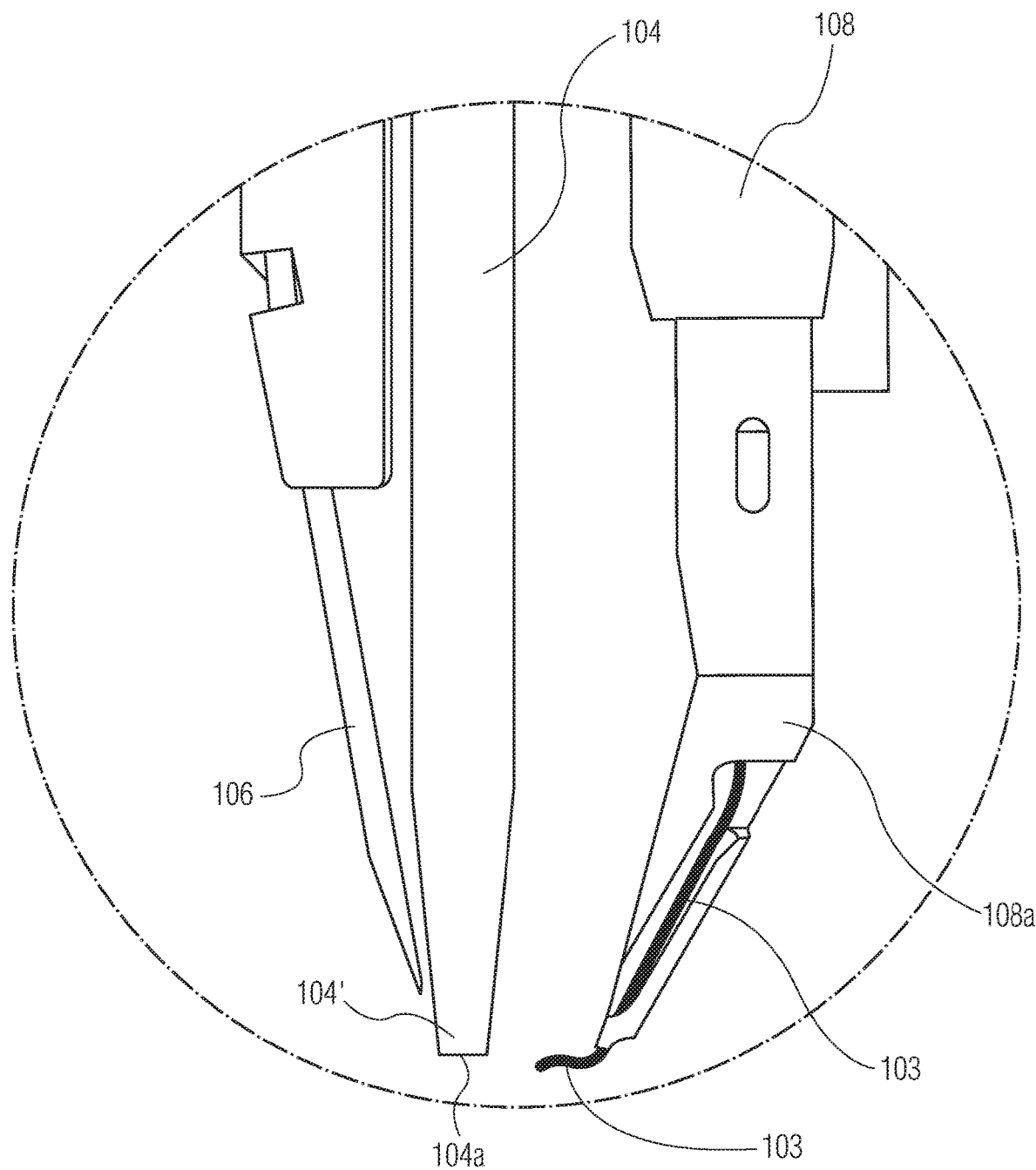

Referring now to FIGS. 2A-2C, a "bond off process" is illustrated. In connection with the cleaning of a wire bonding tool, it is desirable to have access to the bonding surface at the tip of the wire bonding tool. So the wire needs to be moved away from the working surface. An exemplary approach to this process is described in connection with FIGS. 3A-3D. However, sometimes additional clearance between the working surface of the tip and the end portion of the wire is desirable. This specifics of this additional clearance depend on the specific type of cleaning operation. For example, it may be desirable to have the end portion of the wire bent to one side or the other of the working surface. In another example, it may be desirable to have the end portion of the wire bent downward away from the working surface. In any event, it may be desirable to establish some additional level of clearance between the working surface of the tip of the wire bonding tool and the end portion fo the wire. In accordance with exemplary aspects of the invention, use of bond off station 114 may be used to provide such additional clearance.

In connection with bond off station 114, an end portion of wire is "bonded" (e.g., ultrasonically bonded) to a substrate provided at the bond off station 114. Then, after the bonding, the wire is torn (or otherwise separated) from the bonded end portion of the wire. The motions of bond head assembly 102, in connection with this tearing operation, will establish a bend (or other change) in the end portion of the wire carried by wire guide assembly 108. Referring specifically to FIG. 2A, bond off subtrate 114a of bond off station 114 is carried by wire bonding machine support structure 101. Bond off substrate 114a may be considered a consummable substrate, in that after a number of "bond off" operations, bond off substrate 114a may be replaced.

Again referring to FIG. 2A, an end portion of wire 103 is being ultrasonically bonded to bond off substrate 114a. FIG. 2B is a simplified top view of this ultrasonic bonding (with certain elements removed for clarity). After the bonding shown in FIGS. 2A-2B, wire 103 is torn (or otherwise separated) from the last bonded end portion 103a, based on the motions of bond head assembly 102. The result is that, in FIG. 2C, there is another separate bonded end portion 103a (now there are 4 bonded end portions 103a, as opposed to 3 bonded end portions 103a in FIG. 2B), and a bent end portion 103b carried by wire guide assembly 108. As shown in FIG. 2C, because bent end portion 103b is offset from supply of wire 103 (and offset from groove 104b of wire bonding tool 104, see FIG. 5C for example of groove 104b), additional clearance toward the working surface of wire bonding tool 104 is provided. As mentioned above, the bond off process accomplished at bond off station 114 may result in the wire being bent (or otherwise offset from the supply of wire 103 from wire guide assembly 108) in any direction desired given the specifics of the cleaning operation.

Regardless of whether bond off station 114 is utilized as in FIGS. 2A-2C, it may be desirable to provide separation between an end portion of wire 103 and working surface 104a (e.g., see FIGS. 3B and 3D) of wire bonding tool 104. FIGS. 3A-3D illustrate an example of an exemplary separation station 116. In order to provide separation between the end portion of wire 103 and working surface 104a, wire bonding machine 100 may be provided with a moveable (e.g., swivel based) wire guide assembly 108. More specifically, wire guide assembly 108 may be swiveled away from wire bonding tool 104 to provide the desired separation. The action of wire guide assembly 108 may be automatic (or automated) or may be manual. In the case of automated movement of wire guide assembly 108 away from wire bonding tool 104, the movement may be provided by a mechanical interlock, a motion system (e.g., a motor, a cylinder, etc), etc. In the example shown in FIGS. 3A-3D, an automated mechanical interlock is shown. Locking mechanism 110 locks wire guide assembly 108 in position with respect to wire bonding tool 104. In order to enable the swivel action of wire guide assembly 108, locking mechanism 110 must be actuated to the "unlock" position. Block portions 116a and 116b are provided in separation station 116. Through movements of bond head assembly 102, locking mechanism 110 is actuated through engagement with one or both of block portions 116a and 116b. Thus, by mechanical engagement of locking mechanism 110 with block portion 116a and/or 116b (through the motion of bond head assembly 102), locking mechanism 110 is unlocked, and wire guide assembly 108 may move (e.g., swivel) away from wire bonding tool 104 (e.g., see FIGS. 3C-3D). By mechanical re-engagement of locking mechanism 110 with block portion 116a and/or 116b (through the motion of bond head assembly 102), locking mechanism 110 is re-locked, locking wire guide assembly 108 to its operational position with respect to wire bonding tool 104 (e.g., see FIGS. 3A-3B). Of course, FIGS. 3A-3D illustrate just one type of separation station 116; alternative configurations are contemplated within the scope of the invention.

Figure 4A:
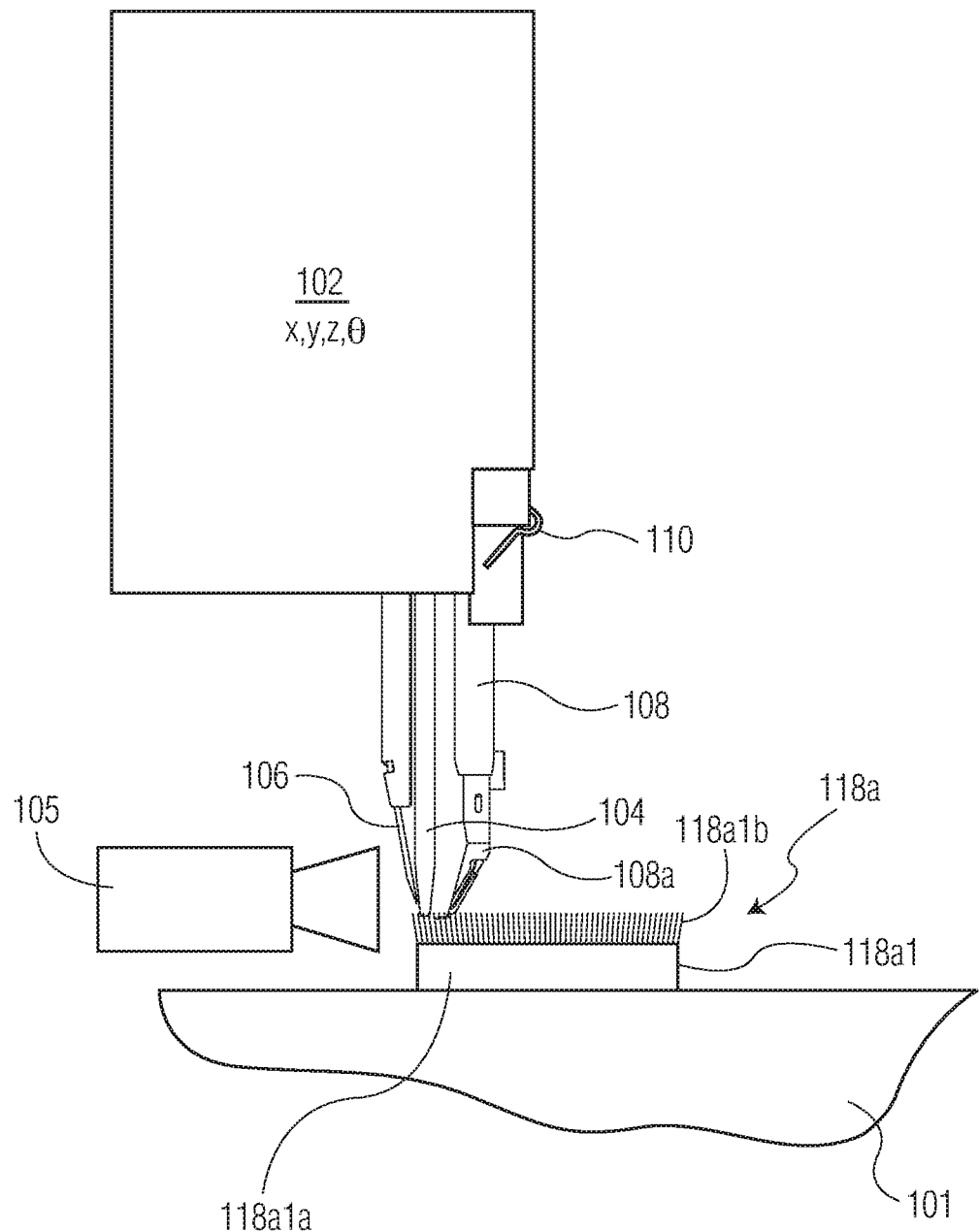
FIGS. 4A-4B are block diagrams illustrating a cleaning station of a wire bonding machine in accordance with an exemplary embodiment of the invention.
Figure 4B:
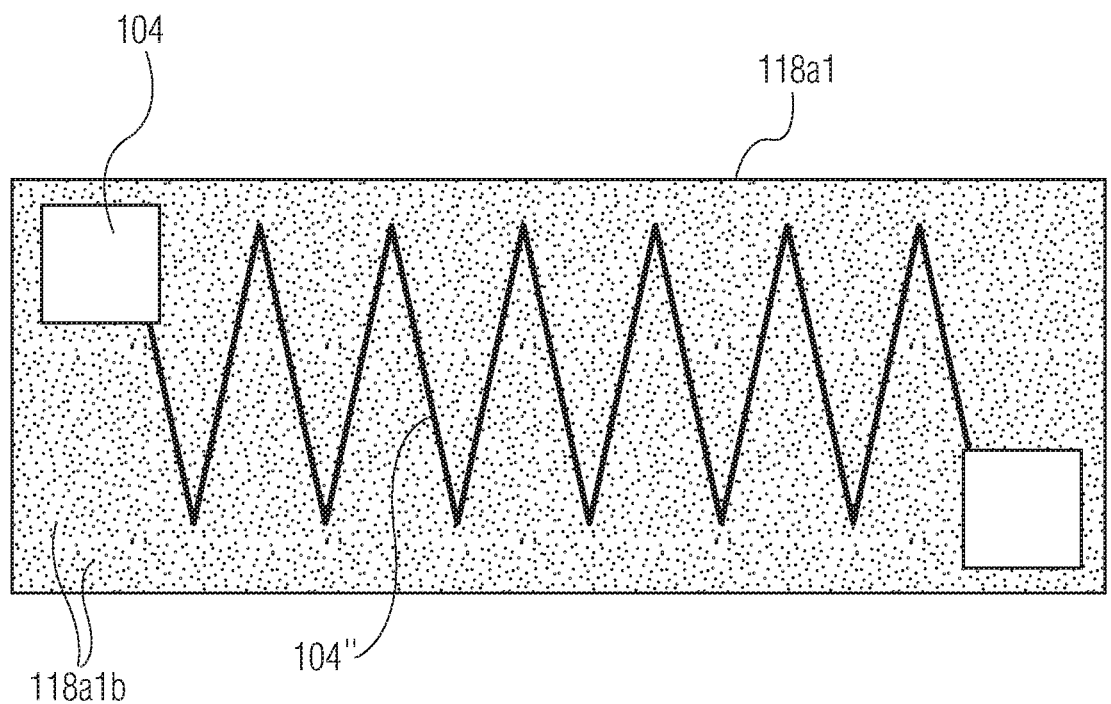
Figure 5A:
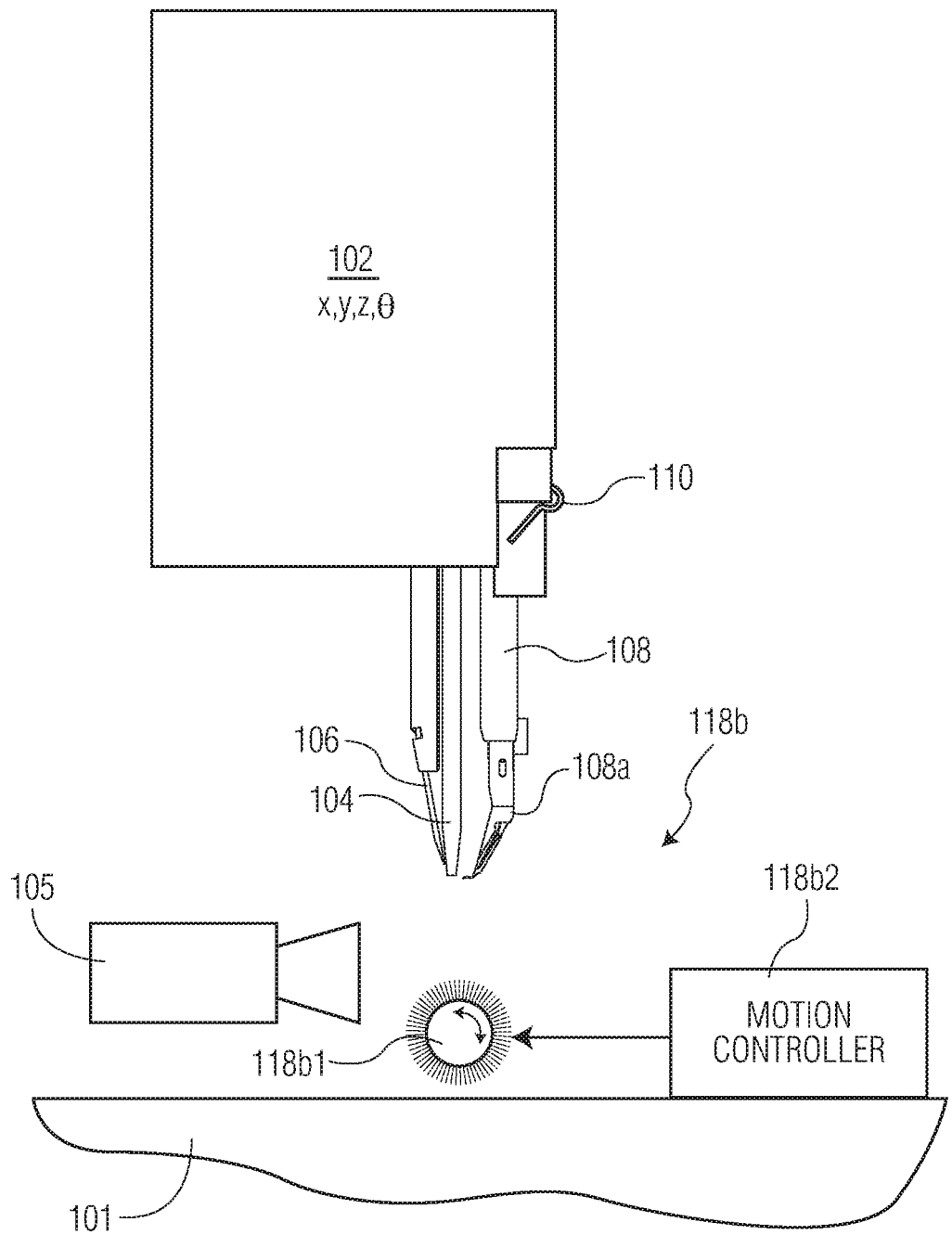
FIGS. 5A-5C are block diagrams illustrating another cleaning station of a wire bonding machine in accordance with another exemplary embodiment of the invention.
Figure 5B:
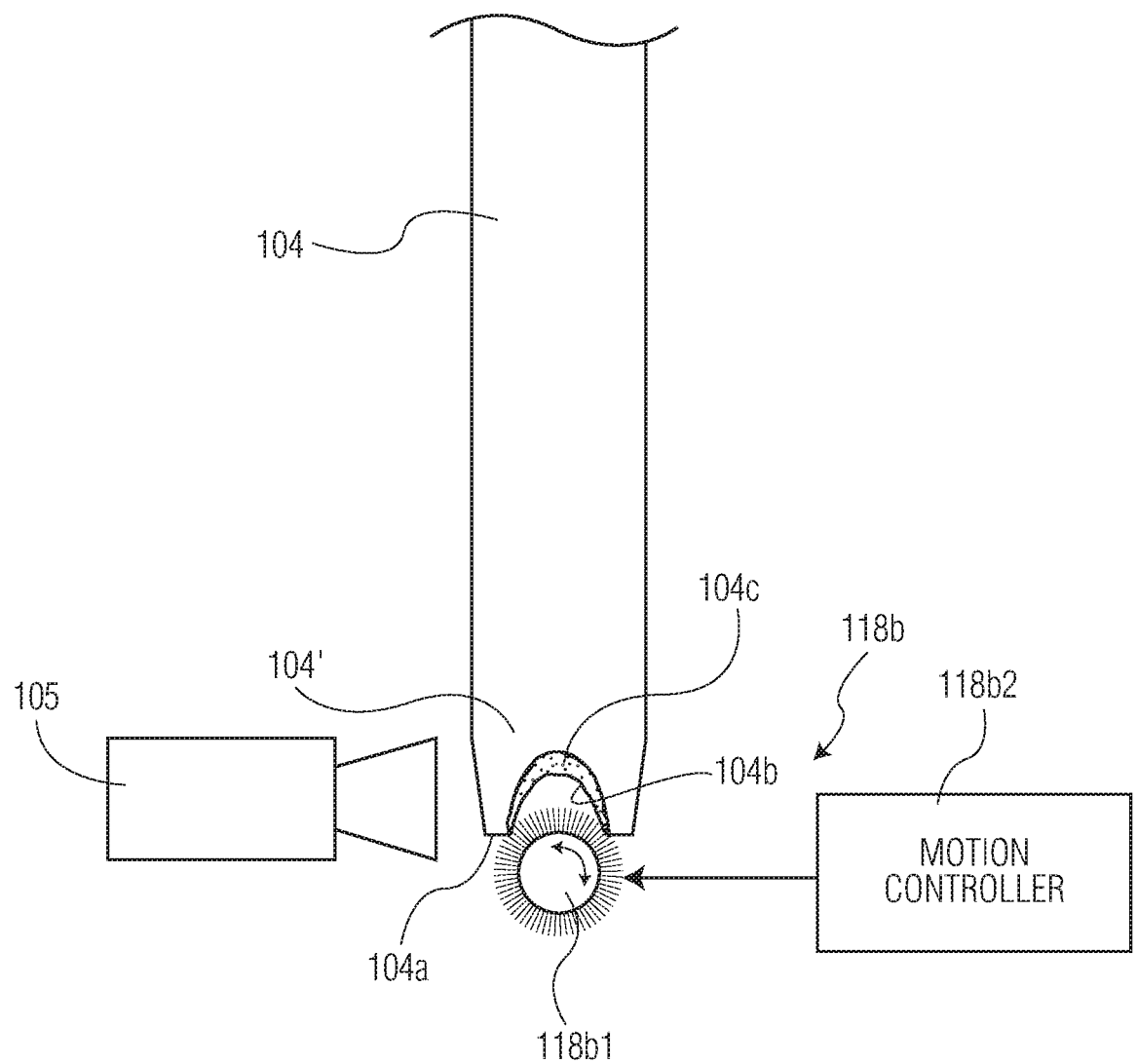
Figure 5C:
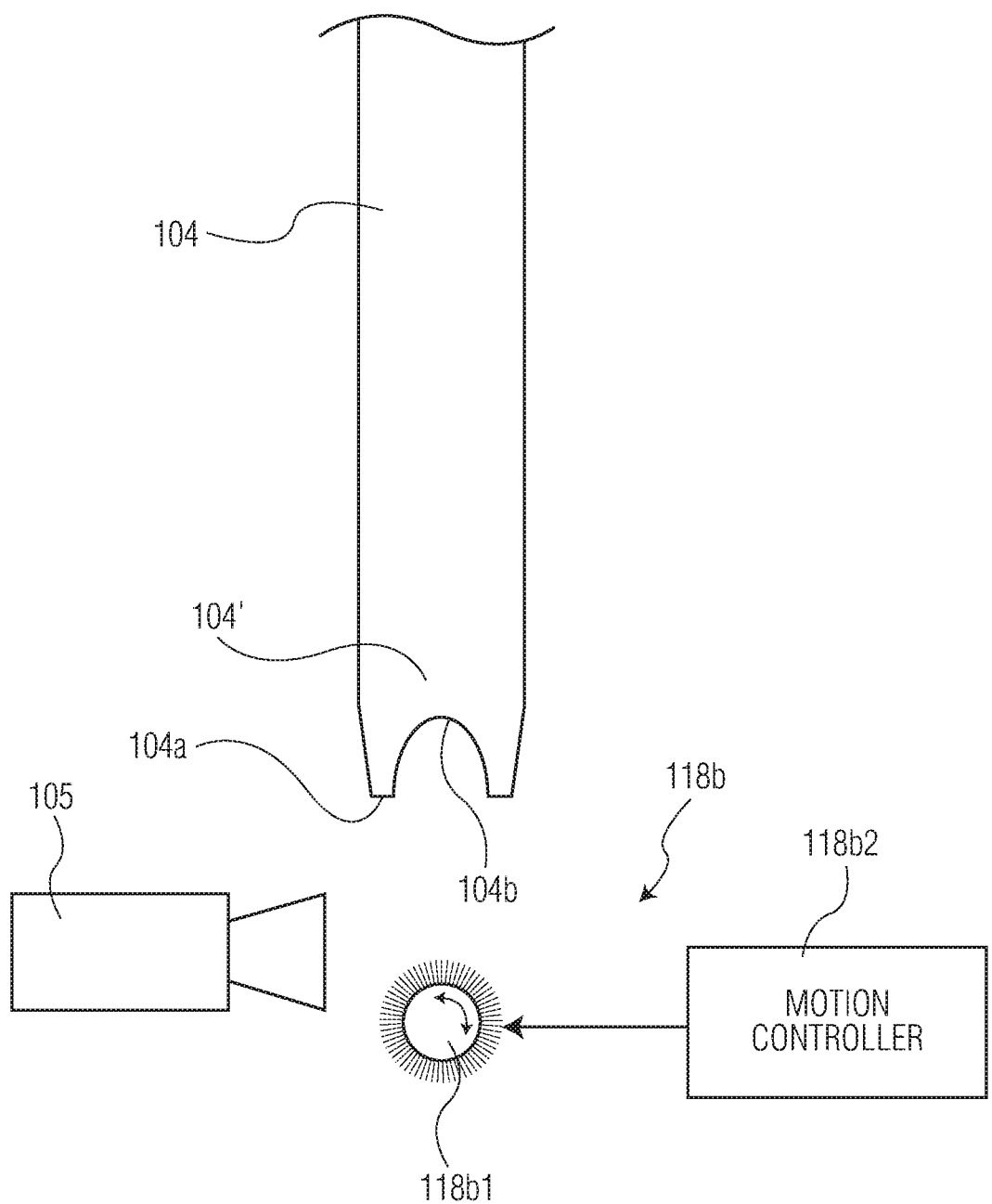
Figure 6:
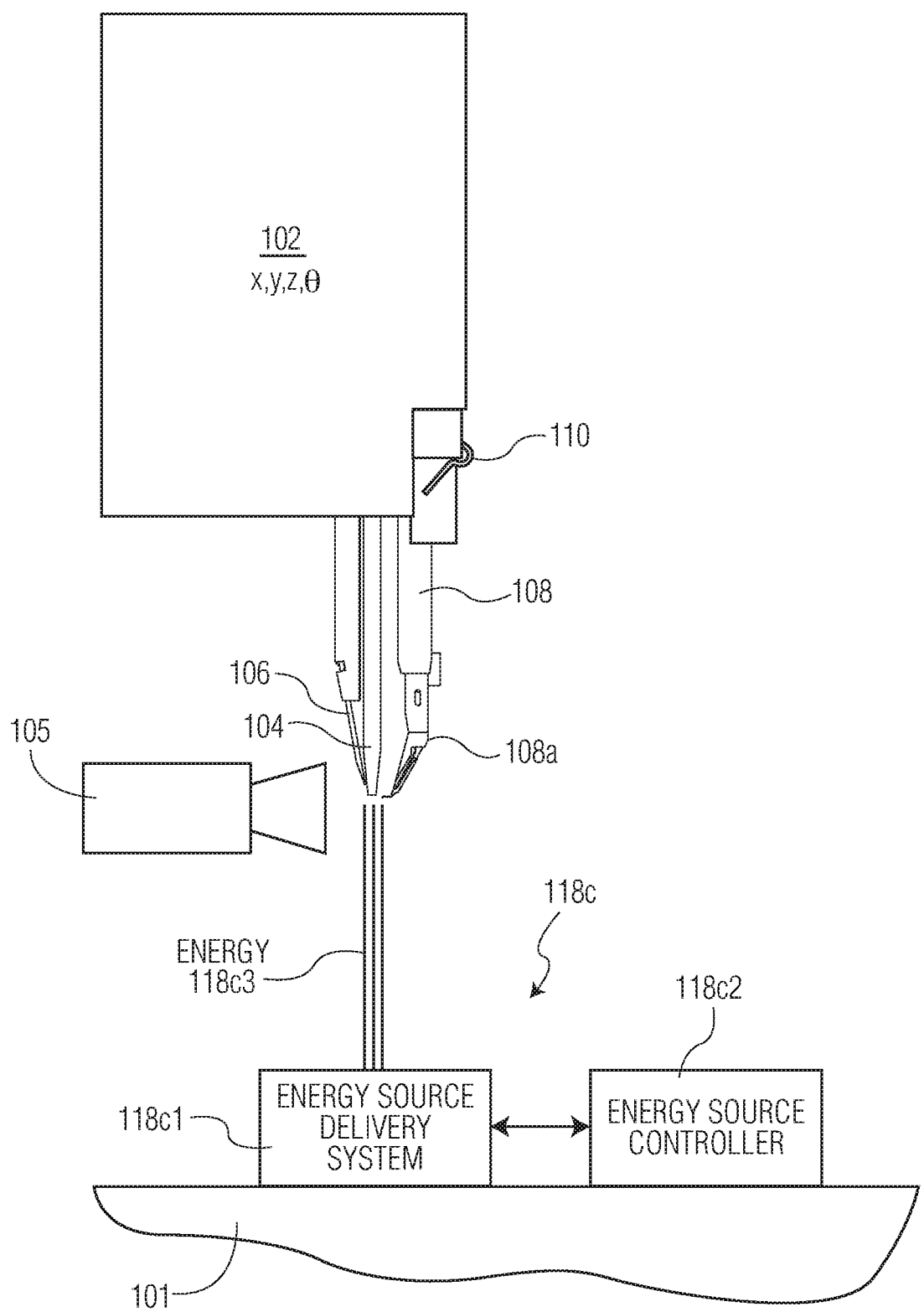
FIG. 6 is a block diagram illustrating yet another cleaning station of a wire bonding machine in accordance with another exemplary embodiment of the invention.
Figure 7:
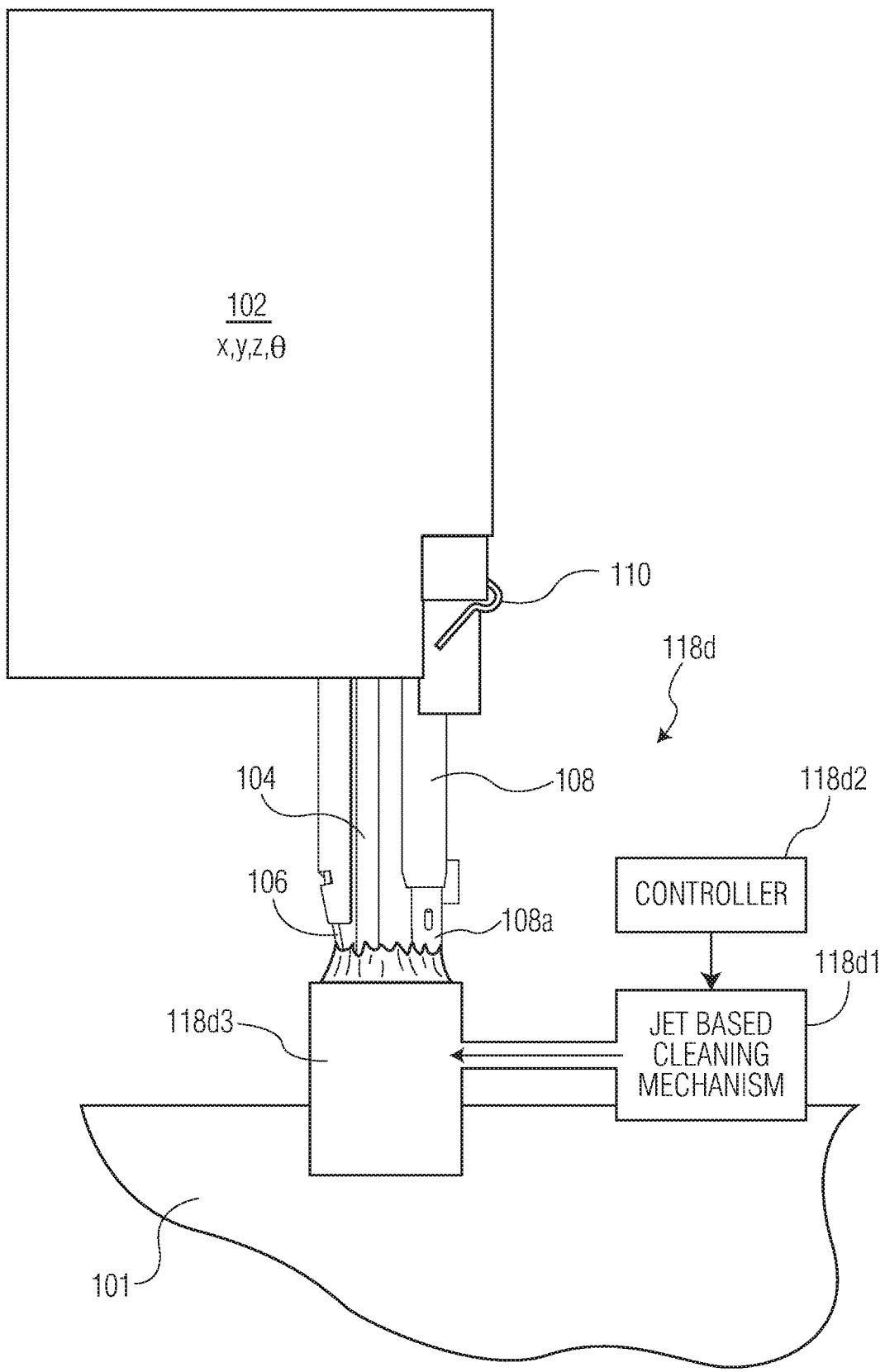
FIG. 7 is a block diagram illustrating yet another cleaning station of a wire bonding machine in accordance with another exemplary embodiment of the invention.

After the operations of bond off station 114 and/or separation station 116, a tip portion 104' (also referred to herein as a "tip" or "tool tip") of wire bonding tool 104 may be ready for cleaning at cleaning station 118 (e.g., see FIG. 1). In accordance with the invention, various different types of cleaning stations 118 may be utilized. FIGS. 4A-4B illustrate cleaning station 118a; FIGS. 5A-5C illustrate cleaning station 118b; FIG. 6 illustrate cleaning station 118c; FIG. 7 illustrate cleaning station 118d; and FIGS. 8A-8D illustrate cleaning station 118e. Any of cleaning stations 118a, 118b, 118c, 118d, and 118e (and any other cleaning station within the scope of the invention) may be used as cleaning station 118 in FIG. 1.

Referring specifically to FIG. 4A, cleaning station 118a includes at least one brush 118a1. Brush 118a1 may be a stationary brush (as described below), or may be a moveable brush (moved with a motion system, not shown). Brush 118a1 includes bristles 118a1b held together by bound portion 118a1a. Brush 118a1 is supported by wire bonding machine support structure 101. Cleaning station 118a also includes debris collection system 105. For example, debris collection system 105 may be a vacuum based system for collecting debris (e.g., debris released from wire bonding tool 104, debris resulting from broken bristles 108a1b, etc.) resulting from cleaning of wire bonding tool 104 at cleaning station 118a. Alternative types of debris collection systems (e.g., magnetic systems for attracting ferrous debris, vessels for at least partially surrounding the cleaning operation for collecting debris, etc.) are contemplated within the scope of the invention.

Bond head assembly 102 moves wire bonding tool 104 into a position such that working surface 104a of tip 104' of wire bonding tool 104 is in contact with bristles 118a1b of brush 118a1. While tip 104' of wire bonding tool 104 is in contact with bristles 118a1b of brush 118a1, bond head assembly 102 follows a predetermined motion profile for moving tip 104' of wire bonding tool 104 with respect to brush 108a1. For example, FIG. 4B illustrates (from a simplified top view perspective) a predetermined motion profile including a zig-zag motion path 104". Of course, alternative predetermined motion profiles are contemplated within the scope of the invention.

In connection with a cleaning operation of tip 104' of wire bonding tool 104 at cleaning station 118a, it may be desirable to use force control (e.g., closed loop control). Specifically, a force sensor (e.g., a load cell, etc., not shown) may be provided as part of bond head assembly 102, or in relation to (e.g., below) brush 118a1. Such a force sensor may be used to measure a force during the cleaning operation. Force data from the force sensor may be provided to a controller or other computer of wire bonding machine 100. Thus, adjustments may be made to the cleaning operation in a closed loop force control mode, using the force data.

Referring specifically to FIG. 5A, cleaning station 118b includes at least one brush 118b1. Brush 118b1 is a rotary brush (e.g., a motor driven brush configured to be actuated in connection with a cleaning operation of wire bonding tool 104), and is driven by motion controller 118b2. FIG. 5B illustrates wire bonding tool 104 rotated 90 degrees with respect to the position shown in FIG. 5A (this change is arbitrary, and is not required within the scope of the invention). FIG. 5B illustrates debris 104c deposited within groove 104b of tip 104' of wire bonding tool 104. Brush 118b1 (including the illustrated bristles) is rotated and used to loosen debris 104c (see clean tool 104, substantially without debris 104c in groove 104b, shown in FIG. 5C). Debris collection system 105 is provided in cleaning station 118b. Debris collection system 105 may be a vacuum based system, or other type of collection system, for collecting debris (e.g., debris released from wire bonding tool 104, debris resulting from broken bristles of brush 118b1, etc.) resulting from cleaning of wire bonding tool 104 with cleaning station 118b.

In connection with a cleaning operation of tip 104' of wire bonding tool 104 at cleaning station 118b, it may be desirable to use force control (e.g., closed loop control). Specifically, a force sensor (e.g., a load cell, etc., not shown) may be provided as part of bond head assembly 102, or in relation to (e.g., below) brush 118b1. Such a force sensor may be used to measure a force during the cleaning operation. Force data from the force sensor may be provided to a controller or other computer of wire bonding machine 100. Thus, adjustments may be made to the cleaning operation in a closed loop force control mode, using the force data.

Referring now to FIG. 6, an energy based cleaning system 118c is illustrated. Cleaning station 118c includes an energy source delivery system 118c1 (e.g., a laser light source, another light source, a plasma source, a heat source, etc.), and an energy source controller 118c2 for controlling operation of energy source delivery system 118c1. Through the operation of energy source delivery system 118c1, energy 118c3 (e.g., laser light energy, other light energy, plasma energy, heat energy, etc.) is directed toward the working surface 104a of tip 104' of wire bonding tool 104. Debris collection system 105 is included in cleaning station 118c. Debris collection system 105 may be a vacuum based system, or other type of collection system, for collecting debris (e.g., debris released from wire bonding tool 104, etc.) resulting from cleaning of wire bonding tool 104 with cleaning station 118c.

Referring now to FIG. 7, an jet based cleaning system 118d is illustrated. Cleaning station 118d includes a jet based cleaning mechanism/source 118d1 (e.g., a gas pressure based cleaning mechanism for cleaning wire bonding tool 104, a $CO_2$ based cleaning mechanism for cleaning wire bonding tool 104, a sand blasting based cleaning mechanism for cleaning wire bonding tool 104, a bead blasting based cleaning mechanism for cleaning wire bonding tool 104, etc.), and a controller 118d2 for controlling operation of jet based cleaning mechanism/source 118d1. Cleaning station 118d also includes vessel 118d3. Through motions of bond head assembly 102, a portion of wire bonding tool 104 (and perhaps other bond head elements such as a portion of wire guide assembly 108 and/or blade 106) are brought into vessel 118d3 through an aperture thereof. Through the operation of jet based cleaning mechanism 118d1, a jet (see the arrow-headed line pointing out of jet based cleaning mechanism 118d1) (e.g., a gas jet such as an air jet, a $CO_2$ jet, a jet of sand blasting material, a jet of bead blast material, etc.) is directed toward tip 104' of wire bonding tool 104 within vessel 118d3 for cleaning debris from tip 104' of wire bonding tool 104 (and/or the other bond head elements within vessel 118d3).

Figure 8A:
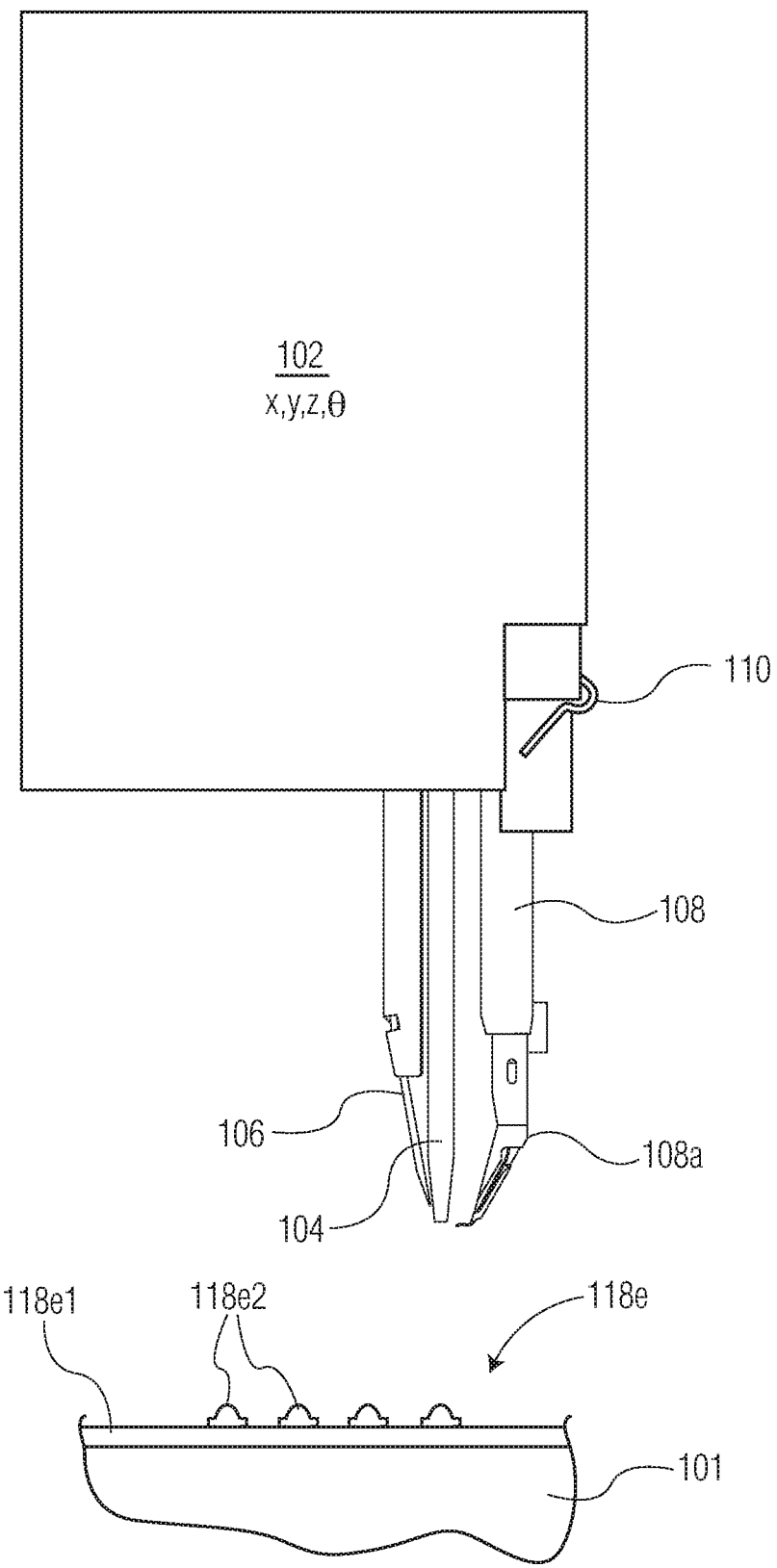
FIGS. 8A-8D are block diagrams illustrating yet another cleaning station of a wire bonding machine in accordance with another exemplary embodiment of the invention.
Figure 8B:
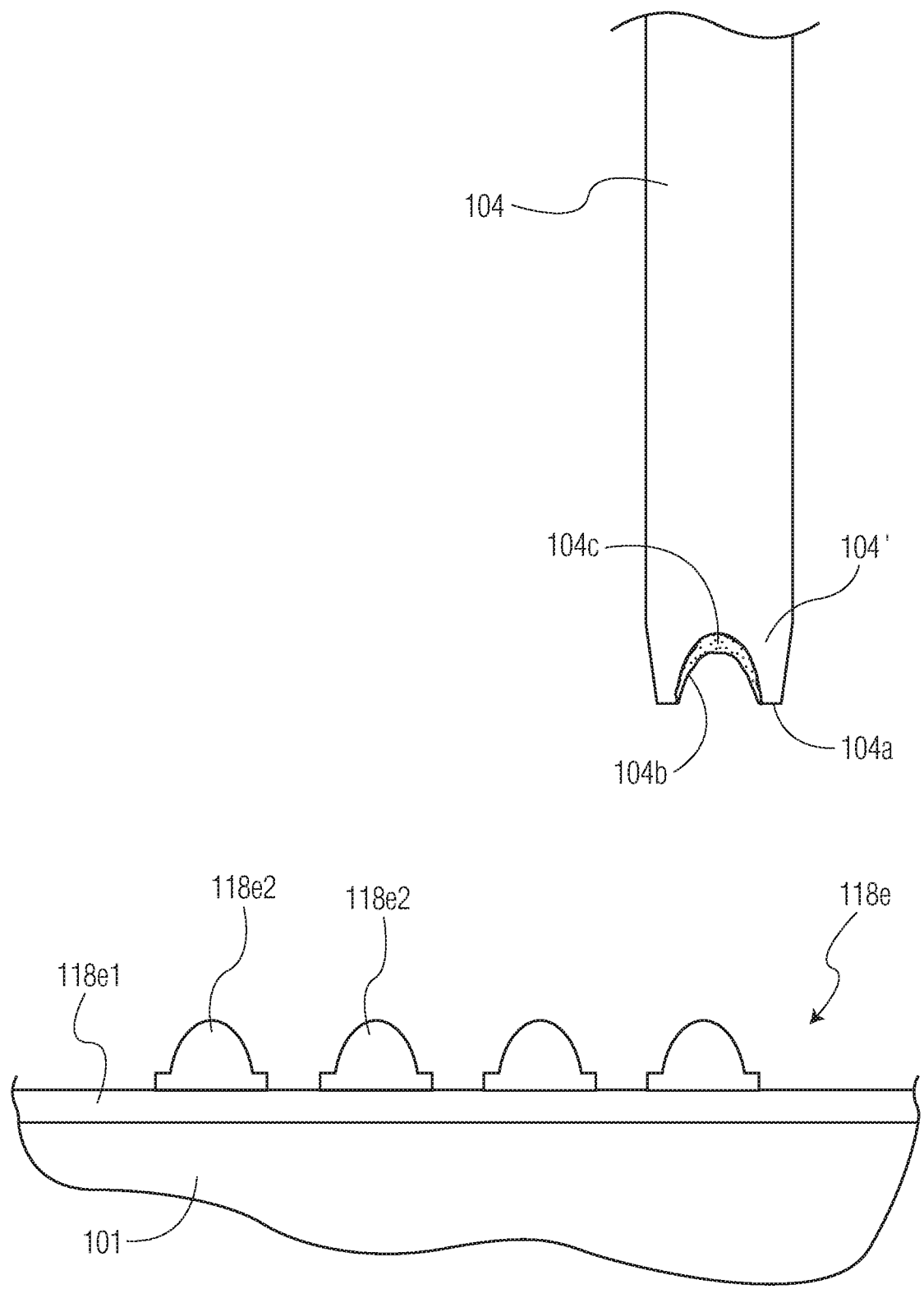
Figure 8C:
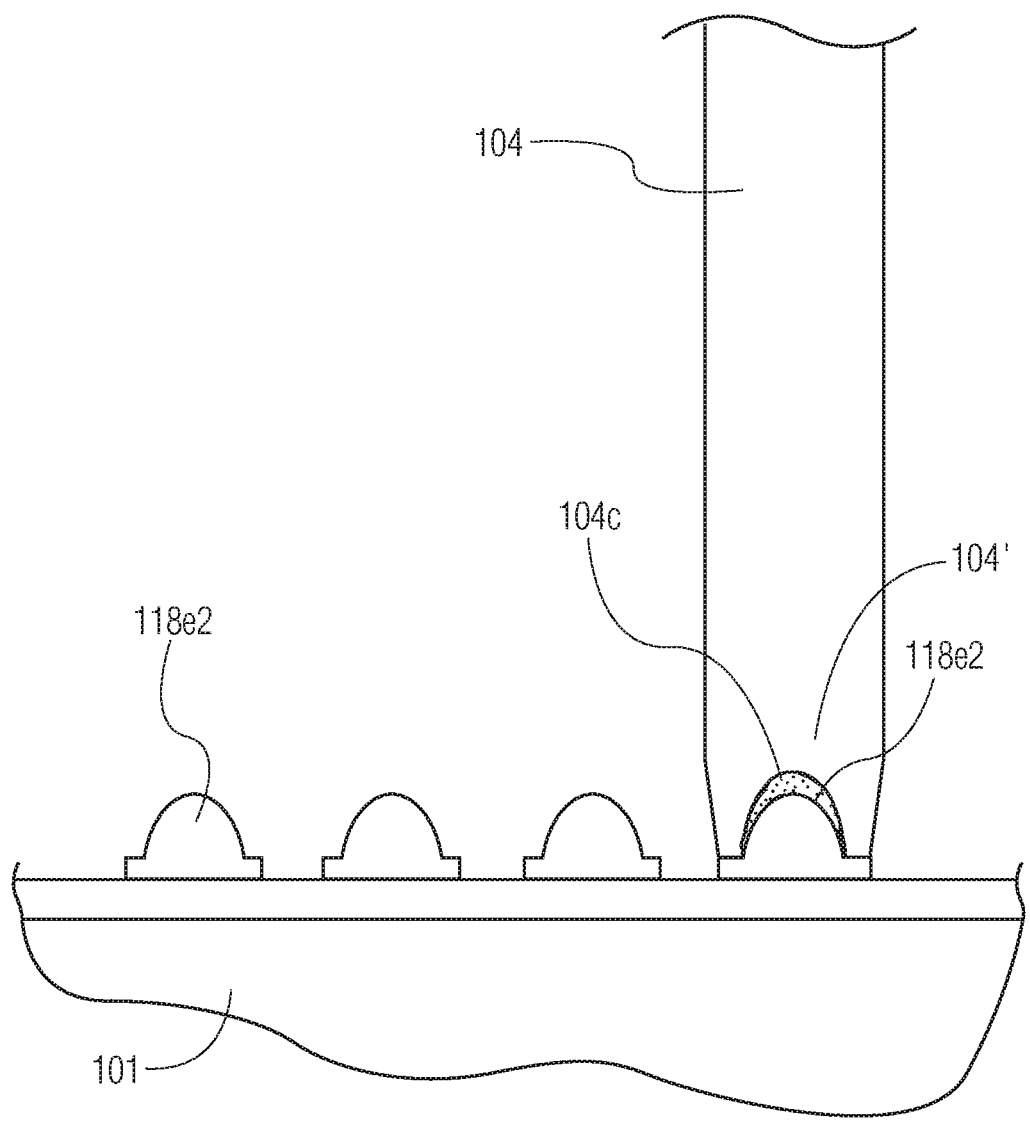
Figure 8D:
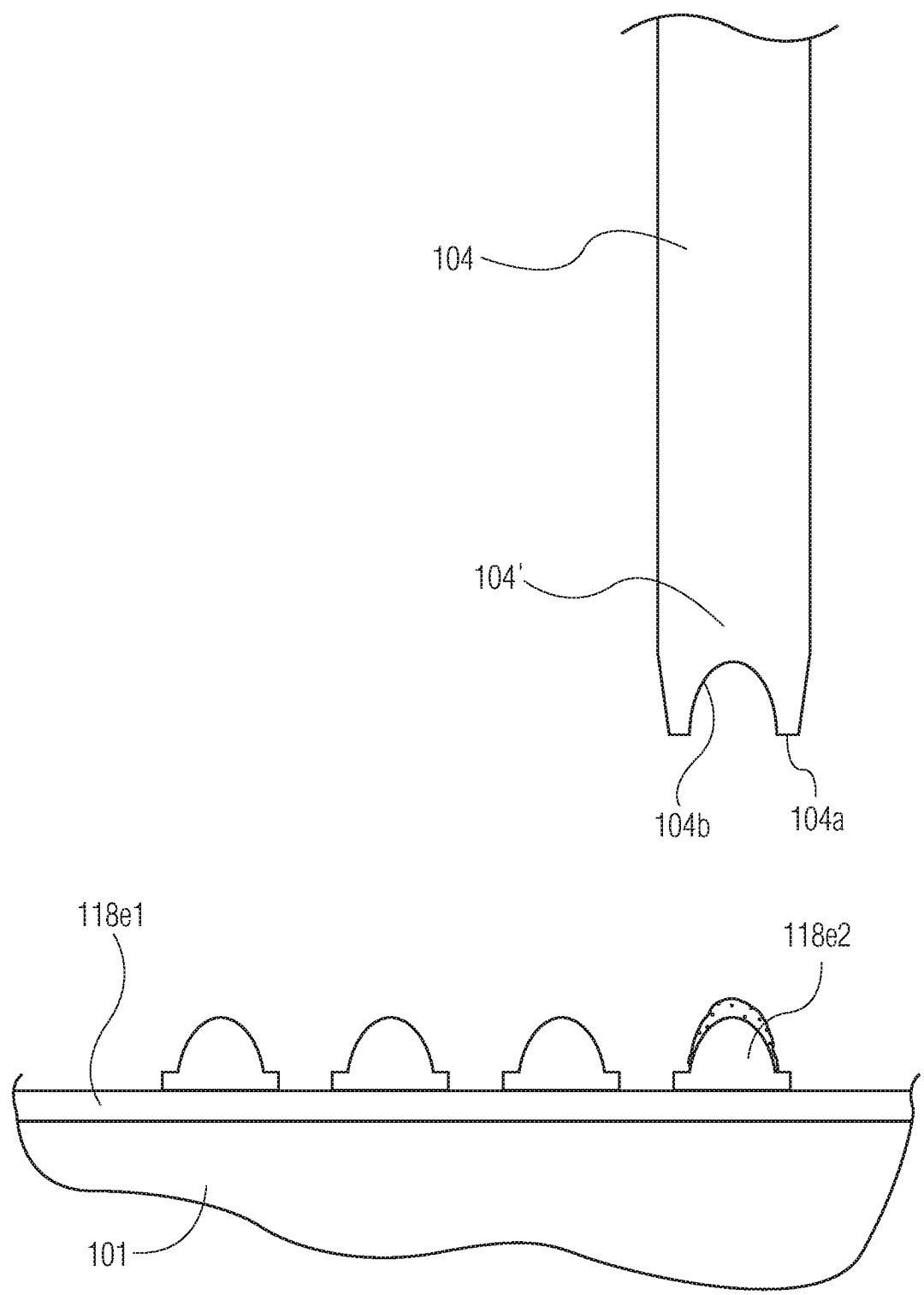

Referring now to FIGS. 8A-8D, a cleaning system 118e is provided. Cleaning station 118e includes a plurality of pre-form structures 118e2 on substrate 118e1. Pre-form structures 118e2 may have a shape corresponding to at least a portion of tip 104' of the wire bonding tool 104 (e.g., groove 104b of tip 104'). Pre-form structures 118e2 are configured to remove debris 104c from wire bonding tool 104. The cleaning operation of cleaning station 118e may utilize an ultrasonic generator carrying wire bonding tool 104, where the ultrasonic generator is part of bond head assembly 102 (such ultrasonic generators are well known to be included in bond head assemblies of wire bonding machines, for ultrasonically bonding wire to a bonding location). FIG. 8B illustrates wire bonding tool 104 rotated 90 degrees with respect to the position shown in FIG. 8A (this change is arbitrary, and is not required within the scope of the invention). FIG. 8B illustrates debris 104c deposited within groove 104b of tip 104' of wire bonding tool 104. FIG. 8C illustrates groove 104b engaging one of pre-form structures 118e2 (e.g., through the motion of bond head assembly 102). Ultrasonic energy may be applied (e.g., using an ultrasonic generator included in bond head assembly 102), and then wire bonding tool 104 is raised (e.g., through the motion of bond head assembly 102) above pre-form structure 118e2 as shown in FIG. 8D. Debris 104c has been transferred to the right-most pre-form structure 118e2, and channel 104b is shown substantially free from debris 104c. In a specific exemplary case, pre-form structures 118e2 may be copper structures (e.g., formed of copper wire or the like) which are particularly suited for removal of, for example, aluminum debris from groove 104b of wire bonding tool 104.

Substrate 118e1 of cleaning station 118e may be considered a consumable substrate, in that after a number of cleaning operations (e.g., one cleaning operation per pre-form structure 118e2 included on substrate 118e1), substrate 118e1 may be replaced.

Of course, other shapes (e.g., different than shapes corresponding to the groove of the wire bonding tool) may be utilized in connection with transferring debris using ultrasonic energy. For example, a flat plate or substrate (e.g., a ceramic plate, a plate with suitable surface roughness, etc.) may be contacted by working surface 104a of wire bonding tool 104, and then ultrasonic energy (and/or a motion profile provided by bond head assembly 102) may be applied to remove certain debris from tip 104' of wire bonding tool 104.

Figure 9A:
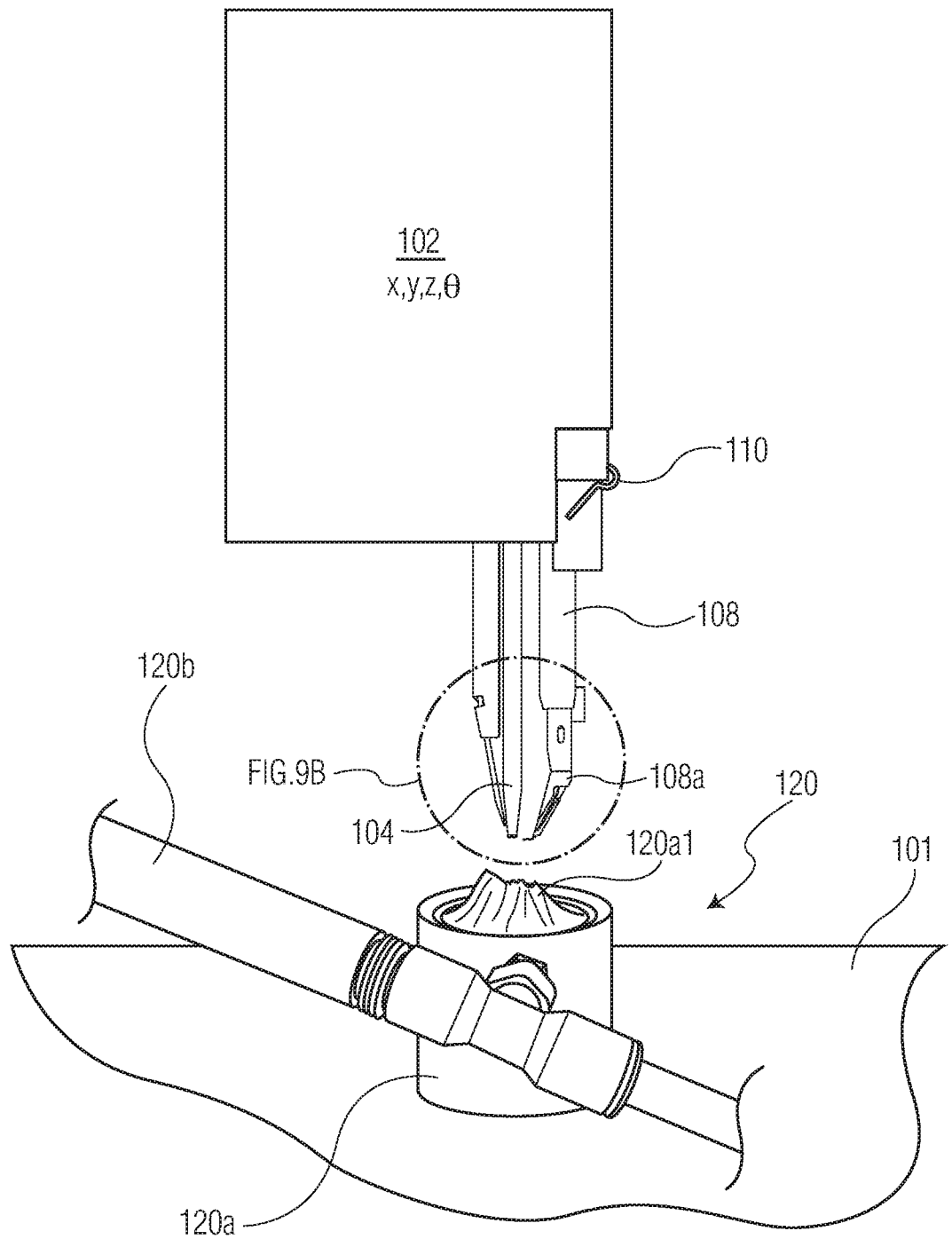
FIGS. 9A-9E are block diagrams illustrating a discard station of a wire bonding machine in accordance with an exemplary embodiment of the invention.
Figure 9B:
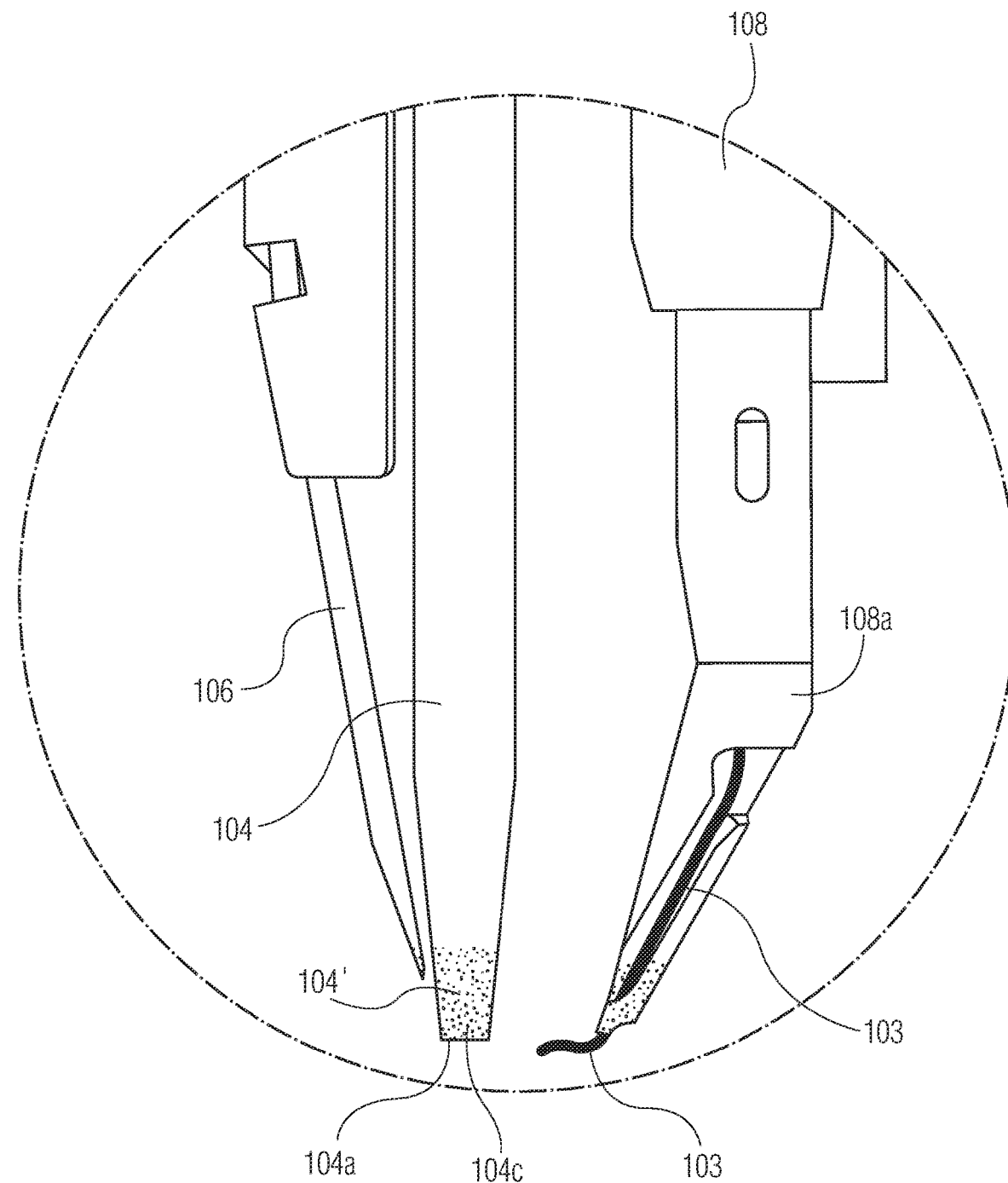
Figure 9C:
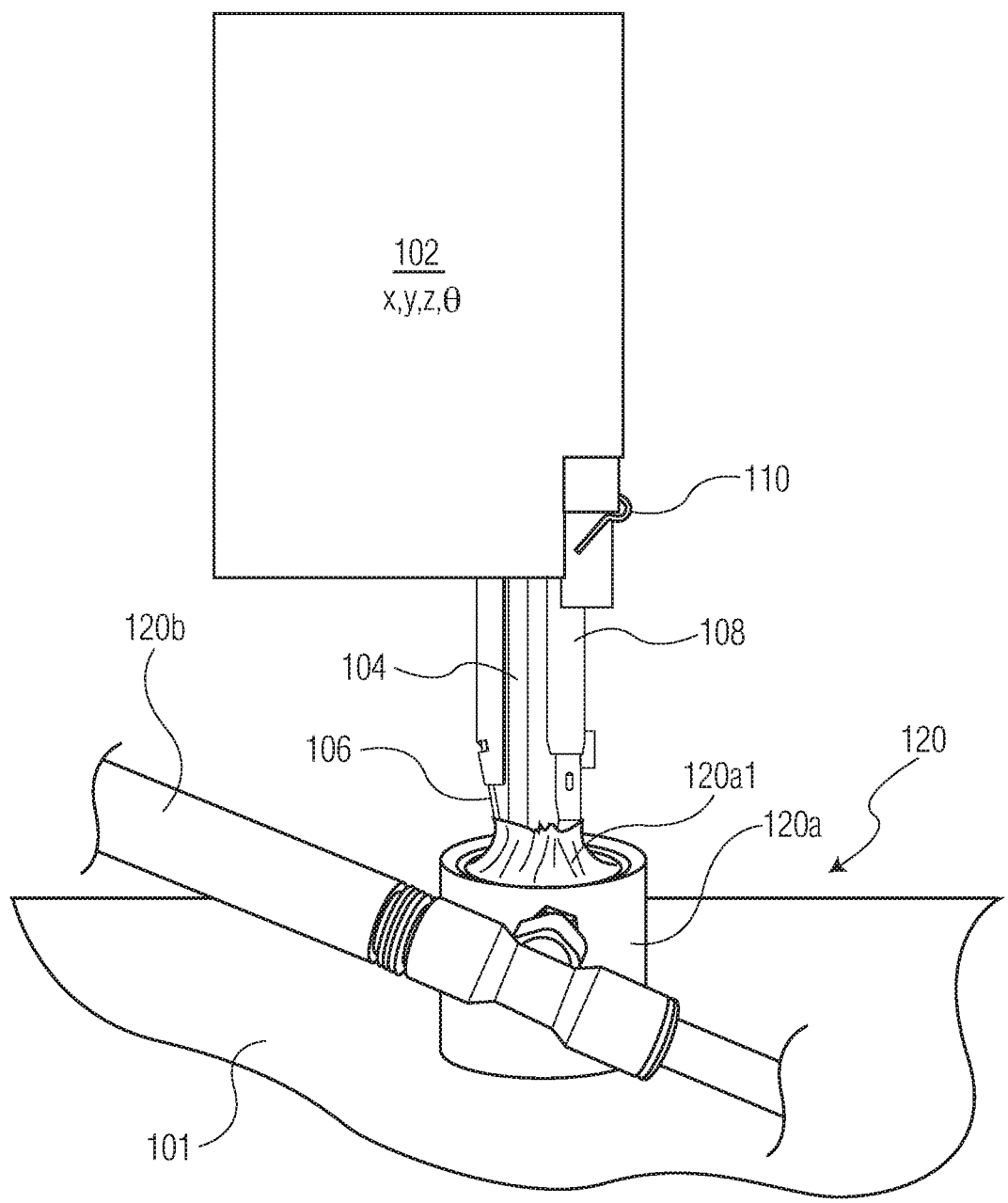
Figure 9D:
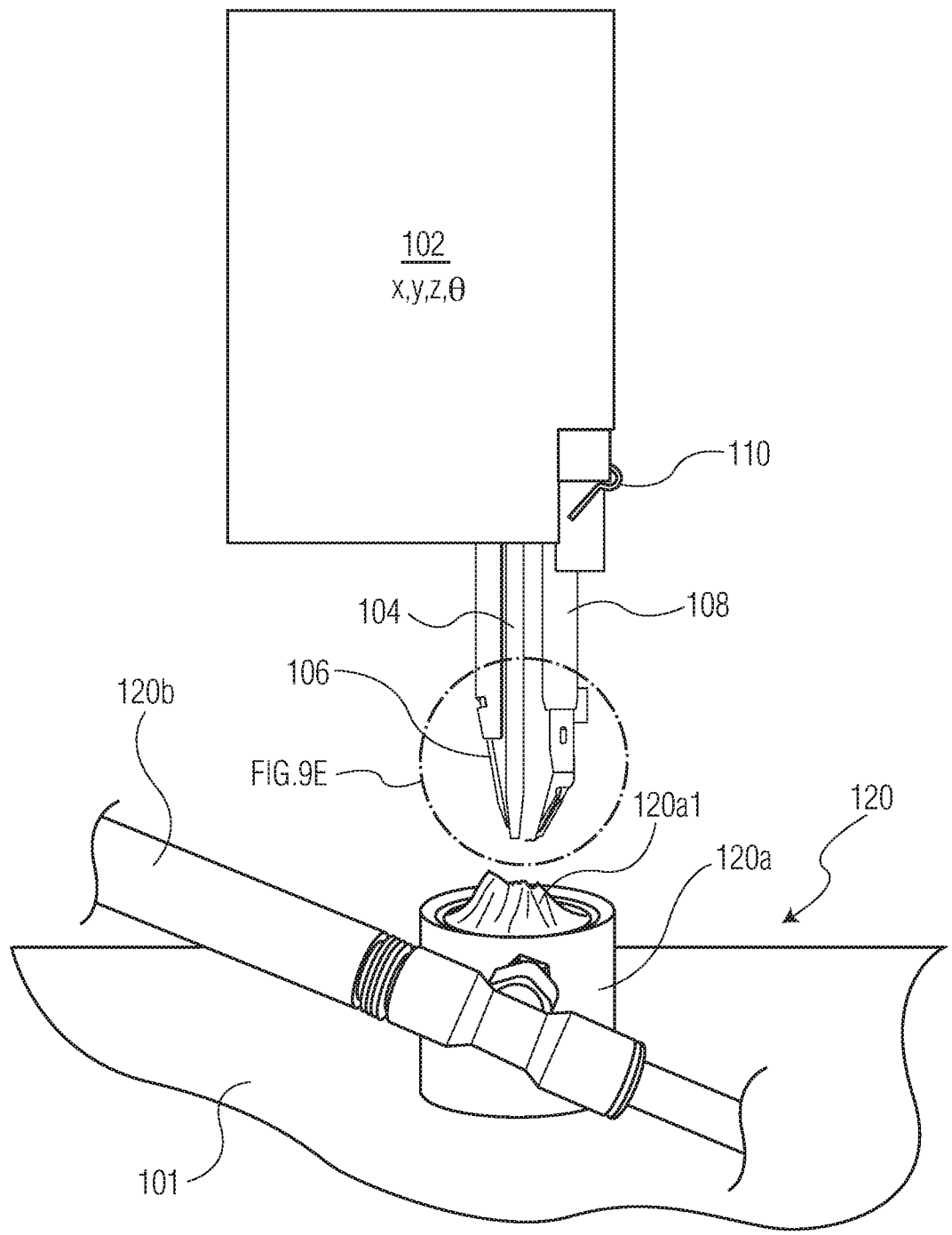
Figure 9E:
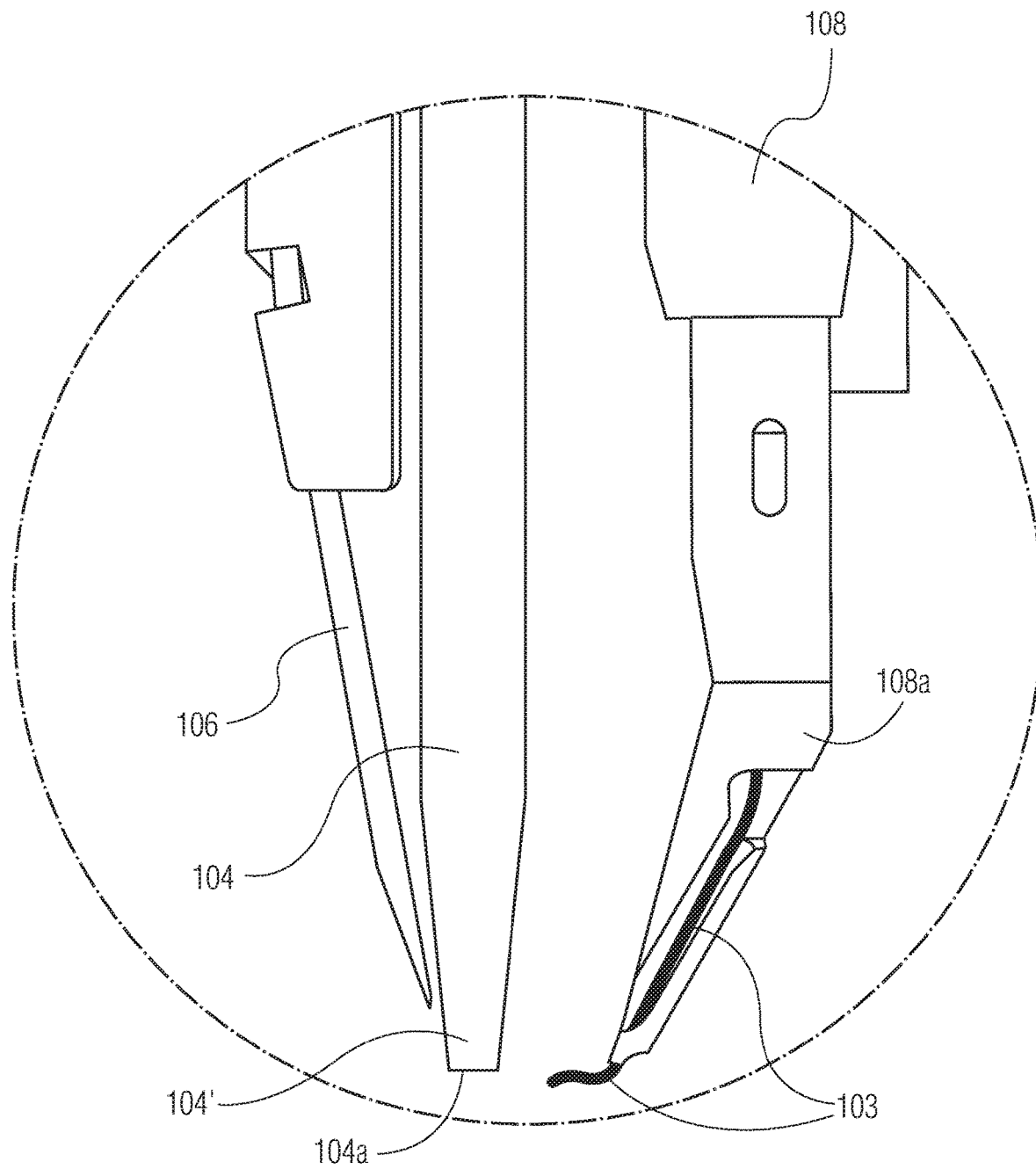

After a cleaning operation (e.g., using any of cleaning stations 118a, 118b, 118c, 118d, 118e, or any other cleaning station within the scope of the invention), an additional step in cleaning may be utilized at a discard station 120 (e.g., see FIG. 1). Such a discard station may be used to remove (e.g., using a forced gas such as air, or vacuum, or other systems) debris from tip 104' of wire bonding tool 104. Such debris may be (i) debris released from wire bonding tool 104 during the previously described cleaning operations, (ii) debris resulting from broken bristles of a brush in applications where the cleaning station includes at least one brush, etc.), etc. FIGS. 9A-9D illustrate an example of such a discard station 120. Discard station 120 includes a vessel 120a (including a lid 120a1), and gas/vacuum source 120b (e.g., air piping, gas piping, vacuum piping, etc). FIG. 9B illustrates debris 104c on tip 104', wire guide 108a, and blade 106. As shown in FIG. 9C, through motions of bond head assembly 102, a portion of wire bonding tool 104 (and perhaps other bond head elements such as a portion of wire guide assembly 108 and/or blade 106) have been brought into vessel 120a through an aperture of lid 120a1. Through the operation of gas/vacuum source 120b (e.g., air or other gas forced into vessel 120a from gas/vacuum source 120b), debris 104c is removed from tip 104', wire guide 108a, and blade 106 (see FIGS. 9D-9E, where such elements are free from debris 104c as compared to FIG. 9B). Of course, alternative discard stations 120 are contemplated (as opposed to the illustrated forced gas/vacuum based systems), such as, for example, magnetic based systems for attracting ferrous based debris.

After the cleaning operation (e.g., performed at one of the inventive cleaning stations, with or without further cleaning at discard station 120) is complete, realignment of the end portion of the wire 103 may be desired, for example, to perform further wire bonding operations. The end portion of wire 103 may be out of position because of the operations at bond off station 114 and/or separation station 116. Further, cleaning and other operations as described herein may result in misalignment of the end portion of wire 103. Thus, it may be desirable to realign the end portion of wire 103 using realign station 122 (e.g., see FIG. 1). FIGS. 10A-10D illustrate an exemplary realign station 122.

Figure 10A:
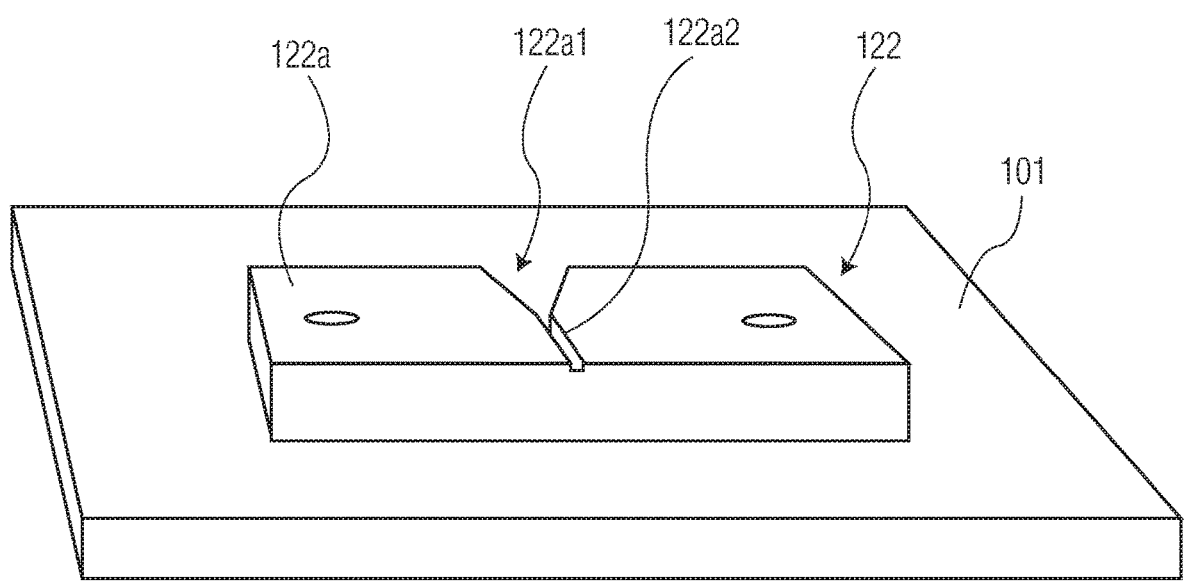
Figure 10B:
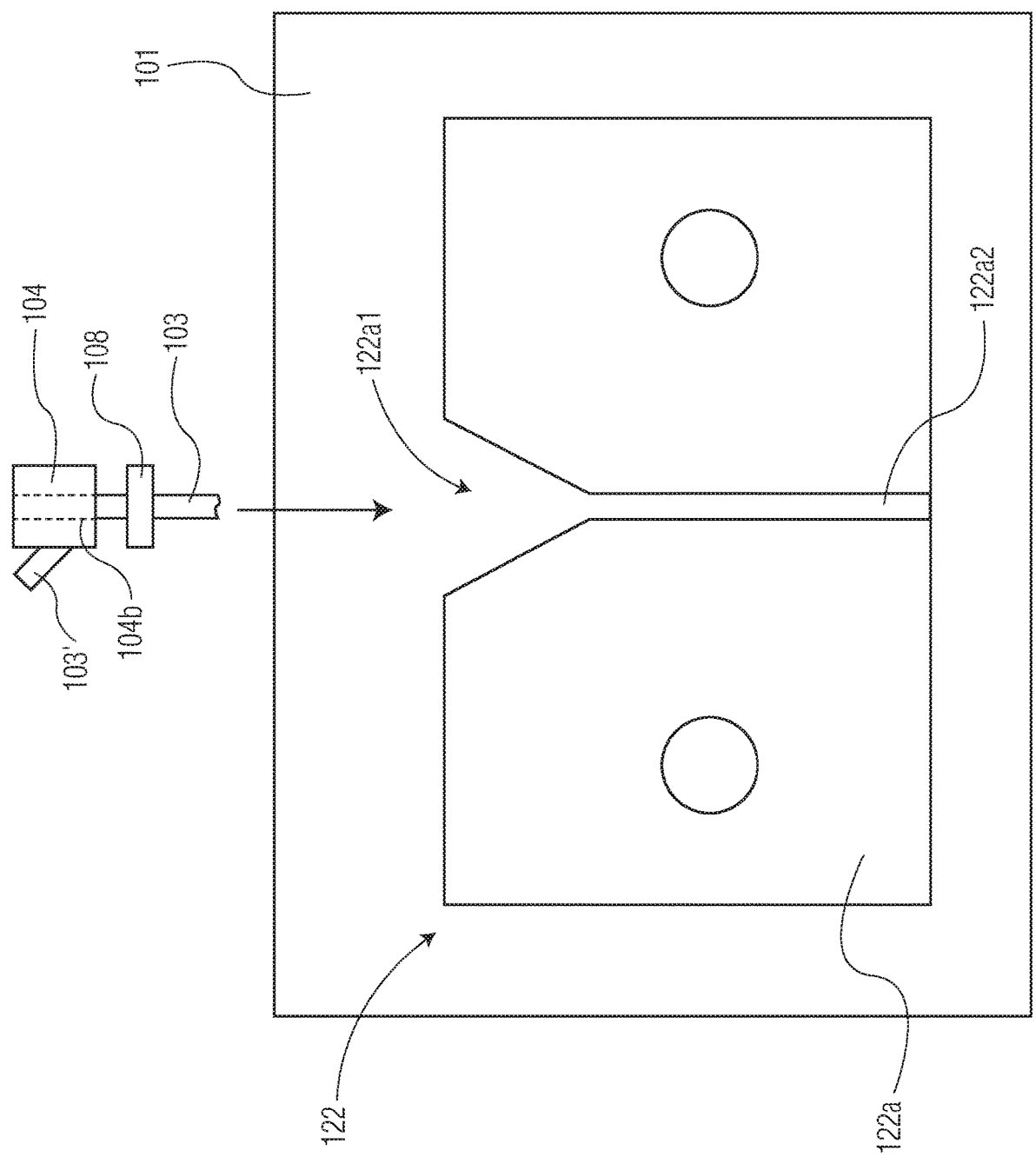
Figure 10C:
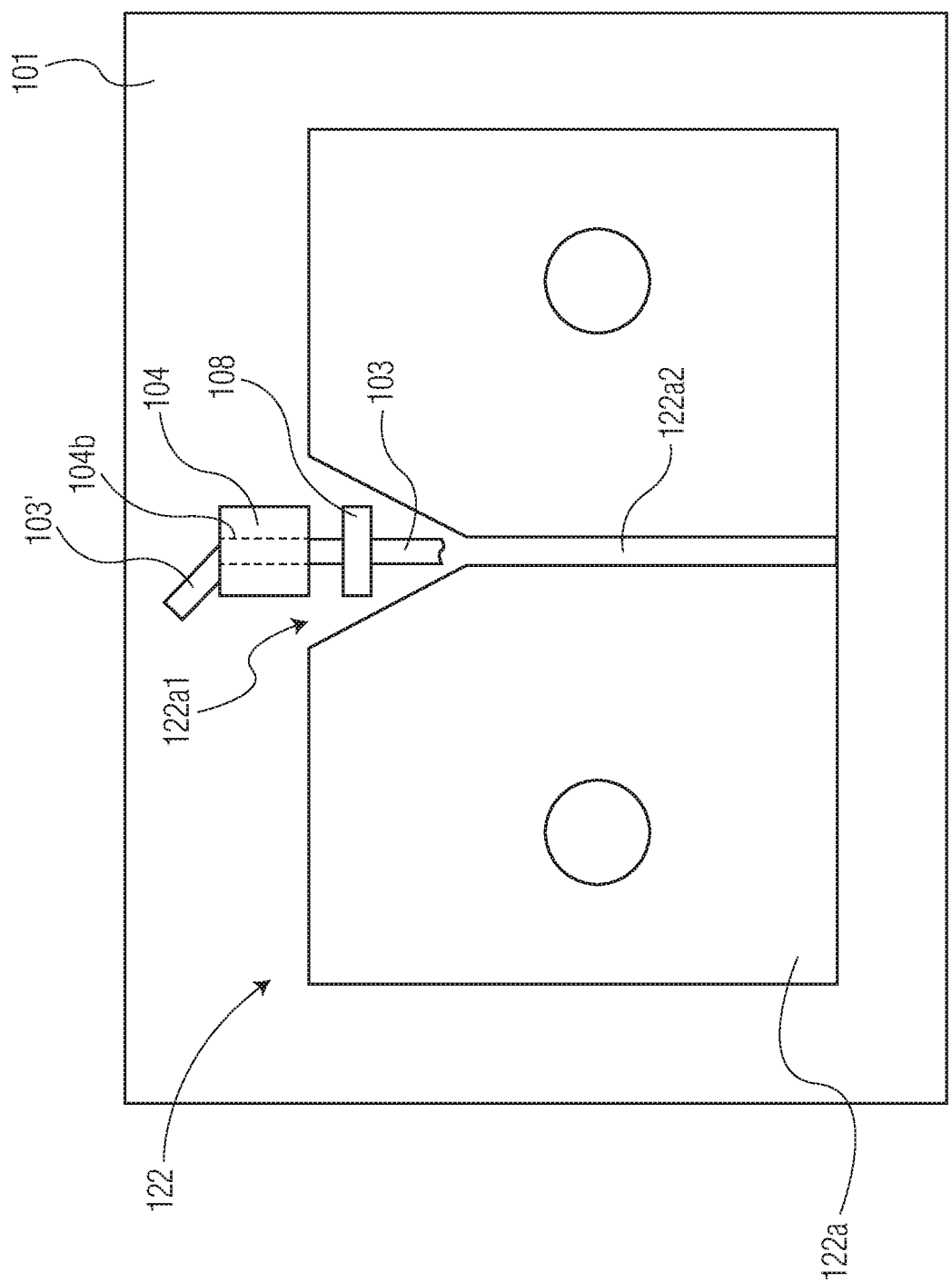

Realign station 122 includes block 122a supported by wire bonding machine support structure 101. Block 122a defines v-shaped groove 122a1 which extends into linear groove 122a2. FIGS. 10B-10C are top views illustrating a process of re-aligning an end portion of wire 103 (e.g., to be in line with groove 104b of tip 104' of wire bonding tool 104). As shown in FIG. 10B, through motions of bond head assembly 102 (not shown), wire 103 (including the "bent" end portion 103') is engaged in v-shaped groove 122a1, and then into linear groove 122a2 (see FIGS. 10C-10D). As shown in FIG. 10D, the end portion 103' of wire 103 is now realigned to be in line with groove 104b of tip 104' of wire bonding tool 104.

After cleaning (and any other processes as desired herein, such as realignment), inspection station 124 (see FIG. 1) may be used to inspect various elements. For example, inspection station 124 may be used to confirm that wire bonding tool 104 (e.g., tip 104' of wire bonding tool 104) is now clean. Further, inspection station 124 may be used to determine that the end portion of wire 103 is properly aligned for entry into groove 104b of tip 104' of wire bonding tool 104. Inspection station 124 may include one or more vision system elements (e.g., cameras, optical elements such as lenses, mirrors, etc.) to image the desired elements. Inspection station 124 may be in communication with a computer of wire bonding machine 104, for example, to allow for image processing of images generated by vision system elements of inspection station 124. Through this image processing, determinations may be made regarding such as, for example: whether tip 104' of wire bonding tool 104) is now clean; whether tip 104' of wire bonding tool 104) needs cleaning in the first place; whether the end portion of wire 103 is properly aligned for entry into groove 104b of tip 104'; etc. While inspection station 124 is shown downstream of realign station 122 in FIG. 1, it is understood that inspection station 124 may be used at any time. For example, inspection station 124 may be used to determine that realignment of end portion of wire 103 is needed—thereby initiating the realignment at realignment station 122. In another example, inspection station 124 may be used to determine that a further cleaning operation (e.g., at discard station 120) should be performed.

In accordance with any of the cleaning operations described herein, an ultrasonic generator (e.g., carrying the wire bonding tool, and included as part of the bond head assembly, as known to those skilled in the art) may be used to provide ultrasonic motion to the tip of the wire bonding tool during at least a portion of such cleaning operations at any of the cleaning stations, or at any of the other stations of wire bonding machine 100 (see FIG. 1).

After cleaning, and inspection, and any other desired processes as described herein, the wire guide may now desirably be returned to the engagement position. For example, this maybe accomplished by reversing the process described above with respect to FIGS. 3A-3D. That is, locking mechanism 110 may be actuated as described above to lock the wire guide assembly 108 back into the engagement position. Following this action, and any other desired checks (e.g., a bond off prior to resuming wire bonding, a pull test of the bond off prior to resuming wire bonding, etc.), the wire bonding machine may now be ready to resume wire bonding operations.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of cleaning a tip of a wire bonding tool on a wire bonding machine, the method comprising the steps of:
   (a1) performing a bond off process at a bond off station of the wire bonding machine to bend an end portion of a wire away from a working surface of the wire bonding tool, the wire being engaged with a bond head assembly of the wire bonding machine, the bond off process including steps of (i) ultrasonically bonding the end portion of the wire to a bond off substrate of the bond off station, and (ii) tearing the wire from a bonded portion of the end portion of the wire by moving the bond head assembly to bend the end portion of the wire away from the wire bonding tool while tearing the wire;
   (a2) moving the end portion of the wire further away from the working surface of the wire bonding tool through the action of a moveable wire guide assembly of the bond head assembly such that the tip of the wire bonding tool is accessible to a cleaning station of the wire bonding machine;
   (b) cleaning at least a portion of the tip of the wire bonding tool with the cleaning station after step (a1) and step (a2), wherein the cleaning station includes at least one brush, the cleaning of step (b) being automatically triggered by the occurrence of a predetermined event;
   wherein, during step (b), while the tip of the wire bonding tool is in contact with the at least one brush, the bond head assembly of the wire bonding machine follows a predetermined motion profile for moving the tip of the wire bonding tool with respect to the at least one brush; and
   (c) realigning the end portion of the wire with a realignment station such that the end portion of the wire is realigned with a groove of the tip of the wire bonding tool after step (b).

2. The method of claim 1 wherein the moveable wire guide assembly is provided on the wire bonding machine for guiding the wire to a position beneath a bonding surface of the wire bonding tool, wherein step (a2) includes moving the moveable wire guide assembly from (i) an engagement position with respect to the wire bonding tool to (ii) a non-engagement position with respect to the wire bonding tool, and wherein step (b) includes the cleaning of at least the portion of the tip of the wire bonding tool when the wire guide is in the non-engagement position.

3. The method of claim 1 wherein the predetermined motion profile includes a zig-zag motion path.

4. The method of claim 1 wherein the bond head assembly carries the wire bonding tool and is configured to move the wire bonding tool along a plurality of axes.

5. The method of claim 4 wherein in connection with step (b) the bond head assembly moves the wire bonding tool into a position such that the tip of the wire bonding tool is in contact with the at least one brush for the cleaning of at least the portion of the tip.

6. The method of claim 1 further comprising a step of inspecting the tip of the wire bonding tool after step (b).

7. The method of claim 1 further comprising a step of collecting debris resulting from the cleaning of at least the portion of the tip of the wire bonding tool with the cleaning station using a debris collection system.

8. The method of claim 1 wherein a level of cleanliness of the wire bonding tool is determined at an inspection location after step (b).

9. The method of claim 1 wherein a force sensor is used to measure a force during the cleaning.

10. The method of claim 1 wherein, during step (a2), the wire bonding machine uses the moveable wire guide assembly to provide a desired separation of the end portion of the wire and the working surface of the wire bonding tool.

11. The method of claim 1 wherein, during step (a2), the wire is moved using the movable wire guide assembly to provide a desired separation of the end portion of the wire and the working surface of the wire bonding tool, the movement of the moveable wire guide assembly being provided by at least one of a mechanical interlock and a motion system.

12. The method of claim 11 wherein the movement of the movable wire guide assembly is a swivel action.

13. The method of claim 1 further comprising a step of determining a first touch position by moving the wire bonding tool to a location on top of the at least one brush, prior to step (b).

14. A method of cleaning a tip of a wire bonding tool on a wire bonding machine, the method comprising the steps of:
(a1) performing a bond off process at a bond off station of the wire bonding machine to bend an end portion of a wire away from a working surface of the wire bonding tool, the wire being engaged with a bond head assembly of the wire bonding machine, the bond off process including steps of (i) ultrasonically bonding the end portion of the wire to a bond off substrate of the bond off station, and (ii) tearing the wire from a bonded portion of the end portion of the wire by moving the bond head assembly to bend the end portion of the wire away from the wire bonding tool while tearing the wire;
(a2) moving the end portion of the wire further away from the working surface of the wire bonding tool through the action of a moveable wire guide assembly of the bond head assembly such that the tip of the wire bonding tool is accessible to a cleaning station of the wire bonding machine;
(b) cleaning at least a portion of the tip of the wire bonding tool with the cleaning station after step (a1) and step (a2), wherein the wire bonding machine includes the moveable wire guide assembly for guiding the wire to a position beneath the working surface of the wire bonding tool, the moveable wire guide assembly being configured for automated movement between (i) an engagement position with respect to the wire bonding tool and (ii) a non-engagement position with respect to the wire bonding tool, wherein the cleaning station includes at least one brush, the cleaning of step (b) being automatically triggered by the occurrence of a predetermined event;
wherein, during step (b), while the tip of the wire bonding tool is in contact with the at least one brush, the bond head assembly of the wire bonding machine follows a predetermined motion profile for moving the tip of the wire bonding tool with respect to the at least one brush; and (c) realigning the end portion of the wire with a realignment station such that the end portion of the wire is realigned with a groove of the tip of the wire bonding tool after step (b).

15. The method of claim 14 wherein a level of cleanliness of the wire bonding tool is determined at an inspection location after step (b).

16. The method of claim 14 wherein a force sensor is used to measure a force during the cleaning.

17. The method of claim 14 wherein, during step (a2), the wire bonding machine uses the moveable wire guide assembly to provide a desired separation of the end portion of the wire and the working surface of the wire bonding tool.

18. The method of claim 14 wherein, during step (a2), the wire is moved using the movable wire guide assembly to provide a desired separation of the end portion of the wire and the working surface of the wire bonding tool, the movement of the moveable wire guide assembly being provided by at least one of a mechanical interlock and a motion system.

19. The method of claim 18 wherein the movement of the movable wire guide assembly is a swivel action.

20. The method of claim 14 further comprising a step of determining a first touch position by moving the wire bonding tool to a location on top of the at least one brush, prior to step (b).

21. A method of cleaning a tip of a wire bonding tool on a wire bonding machine, the method comprising the steps of:
(a1) performing a bond off process at a bond off station of the wire bonding machine to bend an end portion of a wire away from a working surface of the wire bonding tool, the wire being engaged with a bond head assembly of the wire bonding machine, the bond off process including steps of (i) ultrasonically bonding the end portion of the wire to a bond off substrate of the bond off station, and (ii) tearing the wire from a bonded portion of the end portion of the wire by moving the bond head assembly to bend the end portion of the wire away from the wire bonding tool while tearing the wire;
(a2) moving the end portion of the wire further away from the working surface of the wire bonding tool through an action of a moveable wire guide assembly of the bond head assembly such that the tip of the wire bonding tool is accessible to a cleaning station of the wire bonding machine; and
(b) cleaning at least a portion of the tip of the wire bonding tool with the cleaning station after step (a1) and step (a2), wherein the cleaning station includes at least one brush, the cleaning of step (b) being automatically triggered by the occurrence of a predetermined event; and
(c) realigning the end portion of the wire with a realignment station such that the end portion of the wire is realigned with a groove of the tip of the wire bonding tool after step (b),
wherein, during step (b), while the tip of the wire bonding tool is in contact with the at least one brush, the bond head assembly of the wire bonding machine follows a predetermined motion profile for moving the tip of the wire bonding tool with respect to the at least one brush,
wherein, during step (b), a debris collection system is used including at least one of (i) a magnetic system for attracting ferrous debris and (ii) a vessel for at least partially surrounding a cleaning operation for collecting debris.

22. A method of cleaning a tip of a wire bonding tool on a wire bonding machine, the method comprising the steps of:

(a1) performing a bond off process at a bond off station of the wire bonding machine to bend an end portion of a wire away from a working surface of the wire bonding tool, the wire being engaged with a bond head assembly of the wire bonding machine, the bond off process including steps of (i) ultrasonically bonding the end portion of the wire to a bond off substrate of the bond off station, and (ii) tearing the wire from a bonded portion of the end portion of the wire by moving the bond head assembly to bend the end portion of the wire away from the wire bonding tool while tearing the wire;

(a2) moving the end portion of the wire further away from the working surface of the wire bonding tool through an action of a moveable wire guide assembly of the bond head assembly such that the tip of the wire bonding tool is accessible to a cleaning station of the wire bonding machine;

(b) cleaning at least a portion of the tip of the wire bonding tool with the cleaning station after step (a1) and step (a2), wherein the wire bonding machine includes the moveable wire guide assembly for guiding the wire to a position beneath the working surface of the wire bonding tool, the moveable wire guide assembly being configured for automated movement between (i) an engagement position with respect to the wire bonding tool and (ii) a non-engagement position with respect to the wire bonding tool, wherein the cleaning station includes at least one brush, the cleaning of step (b) being automatically triggered by the occurrence of a predetermined event; and (c) realigning the end portion of the wire with a realignment station such that the end portion of the wire is realigned with a groove of the tip of the wire bonding tool after step (b), wherein, during step (b), while the tip of the wire bonding tool is in contact with the at least one brush, the bond head assembly of the wire bonding machine follows a predetermined motion profile for moving the tip of the wire bonding tool with respect to the at least one brush, wherein, during step (b), a debris collection system is used including at least one of (i) a magnetic system for attracting ferrous debris and (ii) a vessel for at least partially surrounding a cleaning operation for collecting debris.

\* \* \* \* \*